(12) United States Patent
Issa

(10) Patent No.: US 10,875,289 B2
(45) Date of Patent: Dec. 29, 2020

(54) 3D PRINTER, RELATED SET OF PARTS AND METHODS

(71) Applicant: Joseph Issa, Montreal (CA)

(72) Inventor: Joseph Issa, Montreal (CA)

(73) Assignee: Joseph Issa, Montreal (CA)

( * ) Notice: Subject to any disclaimer, the term of this patent is extended or adjusted under 35 U.S.C. 154(b) by 125 days.

(21) Appl. No.: 15/758,972

(22) PCT Filed: Sep. 11, 2016

(86) PCT No.: PCT/CA2016/051067
§ 371 (c)(1),
(2) Date: Mar. 9, 2018

(87) PCT Pub. No.: WO2017/041179
PCT Pub. Date: Mar. 16, 2017

(65) Prior Publication Data
US 2019/0084289 A1    Mar. 21, 2019

Related U.S. Application Data

(60) Provisional application No. 62/217,317, filed on Sep. 11, 2015.

(51) Int. Cl.
| | | |
|---|---|---|
| *B33Y 50/00* | (2015.01) | |
| *B33Y 30/00* | (2015.01) | |
| *B29C 64/20* | (2017.01) | |
| *B29C 64/227* | (2017.01) | |
| *B29C 64/118* | (2017.01) | |

(Continued)

(52) U.S. Cl.
CPC ............ *B33Y 50/00* (2014.12); *B29C 64/118* (2017.08); *B29C 64/20* (2017.08); *B29C 64/227* (2017.08); *B33Y 30/00* (2014.12); *G06F 30/00* (2020.01); *B29C 64/393* (2017.08)

(58) Field of Classification Search
CPC ..... B29C 64/118; B29C 64/20; B29C 64/227; B29C 64/393; B33Y 30/00; B33Y 50/00; G06F 30/00
See application file for complete search history.

(56) References Cited

U.S. PATENT DOCUMENTS

| | | | |
|---|---|---|---|
| 8,827,684 B1 * | 9/2014 | Schumacher | B29C 64/20 |
| | | | 425/375 |
| 2005/0280185 A1 * | 12/2005 | Russell | B28B 1/001 |
| | | | 264/308 |

(Continued)

FOREIGN PATENT DOCUMENTS

WO    WO2016147111    9/2016

OTHER PUBLICATIONS

Squire, Lance. Wallace G1 3D Printer [online], Mar. 5, 2015 [retrieved on Nov. 22, 2016]. Retrieved from <http://www.thingiverse.com/thing:710552>.

(Continued)

*Primary Examiner* — Kidest Bahta
(74) *Attorney, Agent, or Firm* — Benoit Yelle; Gowling WLG (Canada) LLP

(57) ABSTRACT

A three-dimensional (3D) printer, a set of parts and associated methods for procuring and/or building the 3D printer for printing a specimen therewithin. The set of parts may be designed to be provided in a single material and for avoiding tolerance stackup.

20 Claims, 13 Drawing Sheets

(51) Int. Cl.
*G06F 30/00* (2020.01)
*B29C 64/393* (2017.01)

(56) References Cited

U.S. PATENT DOCUMENTS

2010/0100222 A1* 4/2010 Skubic .................... B29C 64/20
 700/110
2012/0059503 A1* 3/2012 Pax ....................... B29C 64/106
 700/112
2016/0236408 A1* 8/2016 Wolf ...................... B33Y 30/00

OTHER PUBLICATIONS

Buren, Alec. Study 3D printing from the inside out with 3D printed educational ULIO 3D printer [online]. Aug. 5, 2016 [retrieved on Oct. 11, 2016]. Retrieved from <http://www.3ders.org/articles/20160805-study-3d-printing-from-the-inside-out-with-3d-printed-educational-ulio-3d-printer.html>.
Afinia3D H480 Setup Overview. YouTube [online] [video]. Afinia 3D, Mar. 10, 2014 [retrieved on Oct. 11, 2016]. Retrieved from <https://www.youtube.com/watch?v=ZFtE1AJfBMk>.
"Tolerance analysis", wikipedia [retrieved Aug. 11, 2015].

\* cited by examiner

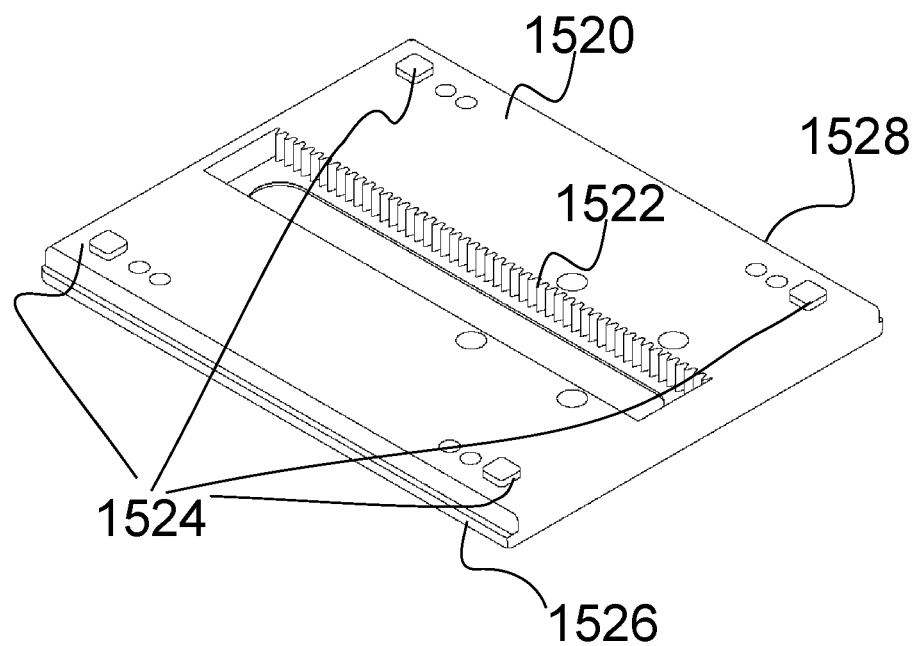
Figure 16
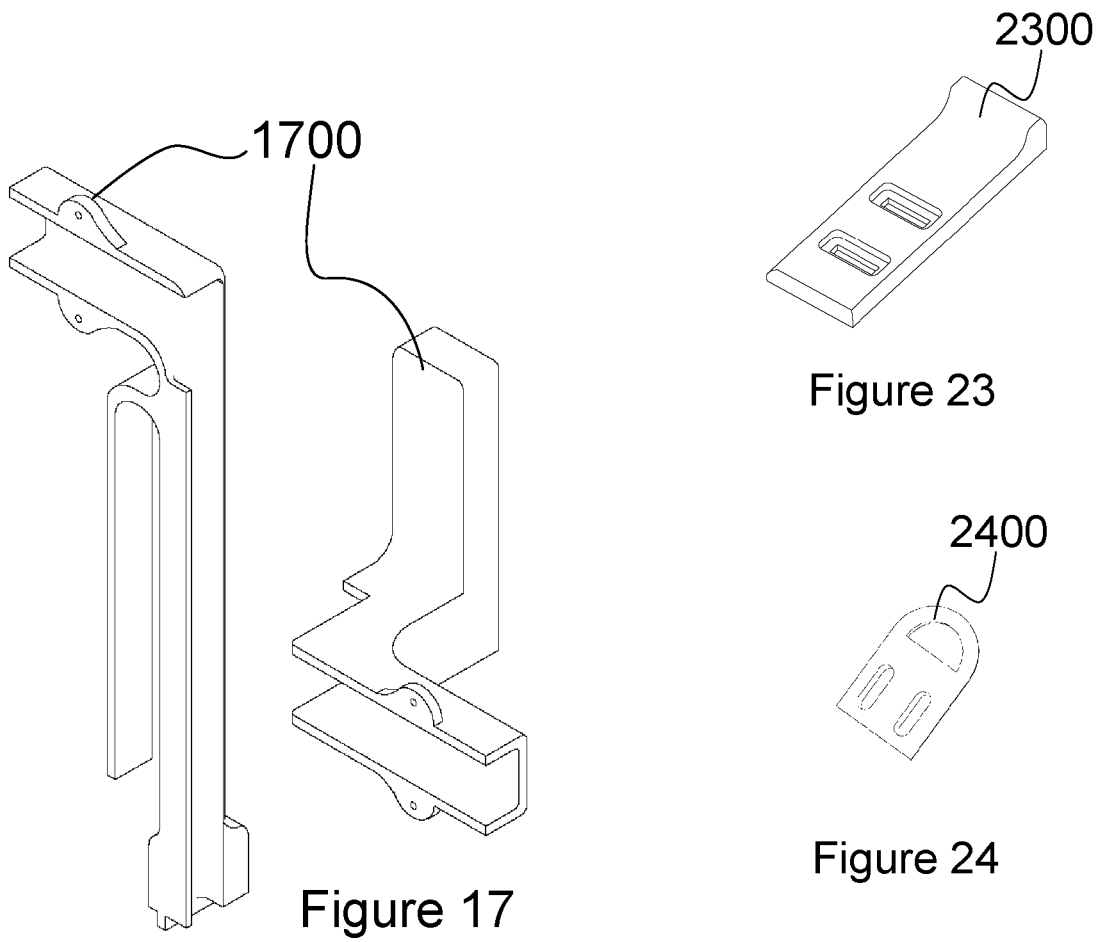
Figure 17
Figure 23
Figure 24

3D PRINTER, RELATED SET OF PARTS AND METHODS

CROSS REFERENCE TO RELATED APPLICATIONS

The present non-provisional patent application is a U.S. National Phase of International Patent Application PCT/CA2016/051067, filed Sep. 11, 2016, which is hereby incorporated by reference in its entirety and which claims priority based upon the prior U.S. provisional patent application entitled "SET OF PARTS FOR BUILDING A 3D PRINTER", application No. 62/217,317, filed Sep. 11, 2015, in the name of ISSA, Joseph, which is incorporated herein by reference in its entirety.

TECHNICAL FIELD

The present invention relates to a 3D tool positioner and, more particularly, to a 3D printer.

BACKGROUND

Existing conventional 3D printers are specialized pieces of equipment that are making their way into the mainstream market. It is currently possible to buy parts to build your own 3D machine, which requires time and knowledge. On the other hand, one can also buy an assembled 3D machine that is ready to use. In both cases, in order to build and assemble the 3D machine, multiple mechanical parts have to be sourced from multiple companies, which increase the cost, complexity and time of the assembled 3D machine.

The present invention at least partly addresses this shortcoming.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A first aspect of the present invention is directed to a set of parts, or a kit comprising one or more sets of parts, for assembling a three-dimensional (3D) printer for 3D printing a specimen therewithin. The set of parts comprises a hot end holder component, a specimen holder component, an x-axis component, a z-axis component and an enclosure. The hot end holder component is for holding a hot end at a definite 3D location within the 3D printer when the set of parts is assembled into the 3D printer. The specimen holder component is for receiving the specimen within the 3D printer. The specimen holder component comprises a y-axis rack and pinion mechanism for moving the specimen holder component along a y-axis within the 3D printer thereby determining a y-axis coordinate of the definite 3D location. At least a y-axis rack section of the y-axis rack and pinion mechanism is provided in a single material used for the specimen holder component and the y-axis rack section, thereby avoiding tolerance stackup when the set of parts is assembled into the 3D printer. The x-axis component comprises an x-axis rack and pinion mechanism for moving the hot end holder component along an x-axis over the specimen holder component thereby determining an x-axis coordinate of the definite 3D location. At least an x-axis rack section of the x-axis rack and pinion mechanism is provided in the single material, which is used for a structure of the x-axis component and the x-axis rack section thereby avoiding tolerance stackup when the set of parts is assembled into the 3D printer. The z-axis component is for moving the specimen holder component along a z-axis within the 3D printer thereby determining a z-axis coordinate of the definite 3D location when the set of parts is assembled into the 3D printer. The enclosure is for receiving a controller of the 3D printer, the controller receiving instructions, when the 3D printer assembled from the set of parts is in use, for changing the definite 3D location of the hot end in relation to the specimen and for selectively extruding material from the hot end to print the specimen.

The set of parts may optionally comprise an x-axis pinion section of the x-axis rack and pinion mechanism and a y-axis pinion section of the y-axis rack and pinion mechanism provided in the single material. The single material may also further be used for a structure of the z-axis component. The z-axis component may yet further comprise a z-axis rack and pinion mechanism for moving the specimen holder component along the z-axis and at least a z-axis rack section of the z-axis rack and pinion mechanism may be provided in the single material as part of the structure of the structure of the z-axis component, wherein the single material used for the structure of the z-axis component and the z-axis rack section thereby avoiding tolerance stackup.

The set of parts may also optionally comprise a z-axis pinion section of the z-axis rack and pinion mechanism provided in the single material thereby providing the rack and pinions mechanisms along the x-axis, the y-axis and the z-axis in the single material.

In some optional embodiments, a single gear depth is determined for the x-axis rack and pinion mechanism and the y-axis rack and pinion mechanism considering a tolerancing of the single material during production of the 3D printer.

The single material may be a 3D printable material. The tolerancing for the 3D printable material may be determined from a non-transitory electronic computer readable medium that contains instructions that, when executed by a manufacturing 3D printer, causes the manufacturing 3D printer to 3D-print the hot end holder component, the specimen holder component comprising the y-axis rack and pinion mechanism, the x-axis component comprising the x-axis rack and pinion mechanism, the z-axis component and the enclosure. One or more tolerancing values for the tolerancing for the 3D printable material may be set by the non-transitory electronic computer readable medium considering precision limits of the manufacturing 3D printer. The specimen may be a component of an additional 3D printer comprising an additional hot end holder component, an additional specimen holder component comprising an additional y-axis rack and pinion mechanism, an additional x-axis component comprising an additional x-axis rack and pinion mechanism, an additional z-axis component and an additional enclosure.

Optionally, the specimen holder component may further comprise a removable receiver tray, the specimen being printed thereon, when the 3D printer assembled from the set of parts is in use, by controllably varying the definite 3D location of the hot end holder component while extruding a compatible material though the hot end in accordance with the received instructions. The removable receiver tray may yet further optionally comprises a specimen receiving plate only partially supported in the removable receiver tray and/or maintained therein by a bold and nut, thereby increasing the precision of the positioning of the receiving plate in the removable receiver tray position.

Optionally, the hot end holder component may further be configured to hold a second tool at a second definite 3D location within the 3D printer and the controller and further receive instructions for changing the second definite 3D location. A difference between the definite 3D location and the second definite 3D location may be fixed. The second tool may be, for instance, a high-speed rotating power tool for carving and/or engraving the specimen positioned on the specimen holder component by changing the second definite 3D location, a laser for carving and/or engraving the specimen positioned on the specimen holder component by changing the second definite 3D location, a second hot end for 3D printing, using a different material than the hot end, on the specimen positioned on the specimen holder component by changing the second definite 3D location, an ink pump for printing, using an ink, on the specimen positioned on the specimen holder component by changing the second definite 3D location, an edible extruding mechanism for 3D printing an edible specimen by changing the second definite 3D location or a marker holder for drawing on the specimen positioned on the specimen holder component by changing the second definite 3D location. The ink may further be conductive, thereby creating at least a portion of an electrical circuit in and/or on the specimen.

The set of parts may optionally further comprise an x-axis motor to be assembled in direct connection with the x-axis pinion section of the x-axis rack and pinion mechanism for moving the tool holder component along the x-axis within the 3D printer and a y-axis motor to be assembled in direct connection with the y-axis pinion section of the y-axis rack and pinion mechanism for moving the specimen holder component along the y-axis within the 3D printer. The z-axis component may further comprise at least one threaded rod for moving the specimen holder component along the z-axis within the 3D printer.

The set of parts may optionally further comprise an x-axis limit-switch for the x-axis component, a y-axis limit-switch for the specimen holder component and a z-axis limit-switch for the z-axis component. The x-axis limit-switch, the y-axis limit-switch and the z-axis limit-switch may allow for calibrating the definite 3D location within the 3D printer when the 3D printer assembled from the set of parts is in use.

Optionally, the single material may be used for every structural and driving components of the set of parts required to provide the definite 3D location.

A second aspect of the present invention is directed to a method for building a 3D printer from a manufacturing 3D printer. The method comprises, at least once, from a computer in communication with the 3D manufacturing printer, causing instructions stored on a non-transitory electronic computer readable medium to be executed by the manufacturing 3D printer to 3D-print one component of the set of parts defined with reference to the first aspect of the present invention. When the set of parts printed by the manufacturing 3D printer is incomplete, the method comprises procuring complementary parts to complete the set of parts together with a set of non-3D-printable parts compatible with the set of parts and an assembly guide from an external provider. When the set of parts printed by the manufacturing 3D printer is complete, the method comprises procuring the set of non-3D-printable parts compatible with the set of parts and the assembly guide from the external provider. The method also comprises assembling a 3D printer from the set of parts and the set of non-3D printable parts.

Optionally, the method may further comprise downloading one or more electronic files, from a remote server, comprising a plurality of mesh representations of at least the ones of the set of parts 3D printed by the manufacturing 3D printer, compiling the electronic files into the instructions and storing the compiled instructions in one or more files, at the computer, compatible with the 3D manufacturing printer.

Optionally, the method may further comprise downloading one or more Computer Assisted Drawing (CAD) files, from a remote server, comprising at least one CAD drawing at least partially presenting one or more components of the set of parts, completing the CAD drawings in accordance with teachings from the procured assembly guide for obtaining a plurality of mesh representations of at least the ones of the set of parts 3D printed by the manufacturing 3D printer, compiling the CAD files into the instructions and storing the compiled instructions in one or more files, at the computer, compatible with the 3D manufacturing printer. Completing the CAD drawings may be performed in the context of an academic learning experience.

Optionally, the method may further comprise downloading one or more computer-aided manufacturing files, from a remote server, comprising the instructions at least partially presenting one or more components of the set of parts in computer-aided manufacturing code and storing the instructions in one or more files, at the computer, compatible with the 3D manufacturing printer.

A third aspect of the present invention is directed to a method for allowing a remote client to procure a 3D printer from a manufacturing 3D printer comprising storing one or more electronic files, available for download from a server, comprising at least one of computer-aided manufacturing code and data for generating the computer-aided manufacturing code to 3D-print by the manufacturing 3D printer one or more components of the set of parts defined relation to the first aspect of the present invention. When the computer-aided manufacturing code allows to 3D-print only some of the set of parts printed by the manufacturing 3D printer, the method comprises making available for purchase complementary parts to complete the set of parts defined in any one of claims 1 to 19 together with a set of non-3D-printable parts compatible with the set of parts and an assembly guide. When the computer-aided manufacturing code allows to 3D-print the set of parts printed by the manufacturing 3D printer, the method comprises making available for purchase the set of non-3D-printable parts compatible with the set of parts and the assembly guide.

The one or more electronic files may optionally comprise instructions to be executed by the manufacturing 3D printer. The one or more electronic files may optionally, alternatively or additionally, comprise at least one CAD drawing at least partially presenting at least the ones from set of parts to be 3D-printed at the manufacturing 3D printer. When complied, the CAD drawings may then provide instructions to be executed by the manufacturing 3D printer.

The assembly guide may optionally comprises teachings for completing the CAD drawings for obtaining a plurality of CAD drawings presenting at least the ones from the set of parts to be 3D printed by the manufacturing 3D printer. Completing the CAD drawings may optionally be performed in the context of an academic learning experience.

A fourth aspect of the present invention is directed to a three-dimensional (3D) printer for 3D-printing a specimen therewithin comprising a hot end, a controller and an enclosure. The controller sets a definite 3D location of the hot end in relation to the specimen and controls the hot end for selectively extruding material to 3D-print the specimen. The enclosure provides a first groove defining a first plane along a z-axis within the 3D printer. The 3D printer also comprises a hot end holder, a specimen holder component and a z-axis motor assembly. The hot end holder is provided on the enclosure and moves the hot end along an x-axis within the 3D printer in accordance with instructions received from the controller, thereby determining an x-axis coordinate of the definite 3D location. The specimen holder component is maintained in the first groove of the enclosure. The specimen holder component comprises a sliding plate over which the specimen is 3D-printed by the hot end and a second groove defining a second plane along a y-axis within the 3D printer. The first plane and the second plane are perpendicular. The specimen holder component also comprises a y-axis motor assembly that causes the sliding plate to slide in the second groove in accordance with instructions received from the controller, thereby determining a y-axis coordinate of the definite 3D location. The z-axis motor assembly is provided on the enclosure and causes the specimen holder component, together with the z-axis motor assembly, to slide in the first groove along the first plane in accordance with instructions received from the controller, thereby determining a z-axis coordinate of the definite 3D location.

In some embodiments, the first plane and second plane may intersect along an edge of the specimen holder component in the x-axis.

The 3D printer may optionally further comprise a removable receiver tray positioned over the sliding plate. The removable receiver tray may further comprise a specimen receiving plate, the specimen being printed thereon. The specimen receiving plate may only partially be supported in the removable receiver tray, thereby increasing precision of positioning of the receiving plate in the removable receiver tray.

In some embodiments, the y-axis motor assembly may comprise a y-axis rack and pinion mechanism. The y-axis rack thereof is integrated in the sliding plate of the specimen holder component. The y-axis motor assembly may also comprise a y-axis motor, fixably maintained under the specimen holder component, for controllably rotating the y-axis pinion of the y-axis rack and pinion mechanism in accordance with instructions received from the controller.

In some embodiments, the z-axis-motor assembly may comprise a z-axis rack and pinion mechanism. The z-axis rack thereof is integrated in the specimen holder component. The z-axis-motor assembly may also comprise a z-axis motor, fixably maintained on the enclosure, for controllably rotating the z-axis pinion of the z-axis rack and pinion mechanism in accordance with instructions received from the controller.

In some embodiments, the hot end holder comprises an x-axis-motor assembly comprising an x-axis rack and pinion mechanism. The x-axis rack thereof is slidably engaged in a third groove of the enclosure along the x-axis and is solidarized with the hot end. The x-axis-motor assembly may also comprise an x-axis motor, fixably maintained on the enclosure, for controllably rotating the x-axis pinion of the x-axis rack and pinion mechanism in accordance with instructions received from the controller.

In some embodiments, the 3D printer may further comprise an x-axis limit-switch for the hot end holder, a y-axis limit-switch for the specimen holder component and a z-axis limit-switch for the z-axis component. The x-axis limit-switch, the y-axis limit-switch and the z-axis limit-switch are used for calibrating the definite 3D location within the 3D printer.

In some embodiments, the 3D printer may further comprise specimen holder adjustment tabs on the specimen holder component in parallel to the first plane to impede non-z-axis-movements of the specimen holder component in the first groove.

In some embodiments, the 3D printer may further comprise one or more sliding plate adjustment tabs over the specimen holder component in parallel to the second plane to impede non-y-axis movements of the sliding plate component in the second groove.

BRIEF DESCRIPTION OF THE DRAWINGS

Further features and exemplary advantages of the present invention will become apparent from the following detailed description, taken in conjunction with the appended drawings, in which:

FIG. 16 is a perspective view of an exemplary rack portion of the y-axis of a 3D printer in accordance with the teachings of the present invention;

FIG. 17 is a perspective view of an exemplary wire cover of a 3D printer in accordance with the teachings of the present invention;

FIG. 23 is a perspective view of an exemplary adjustment tab in accordance with the teachings of the present invention;

FIG. 24 is a perspective view of an exemplary adjustment tab in accordance with the teachings of the present invention;

DETAILED DESCRIPTION

Figure 1:
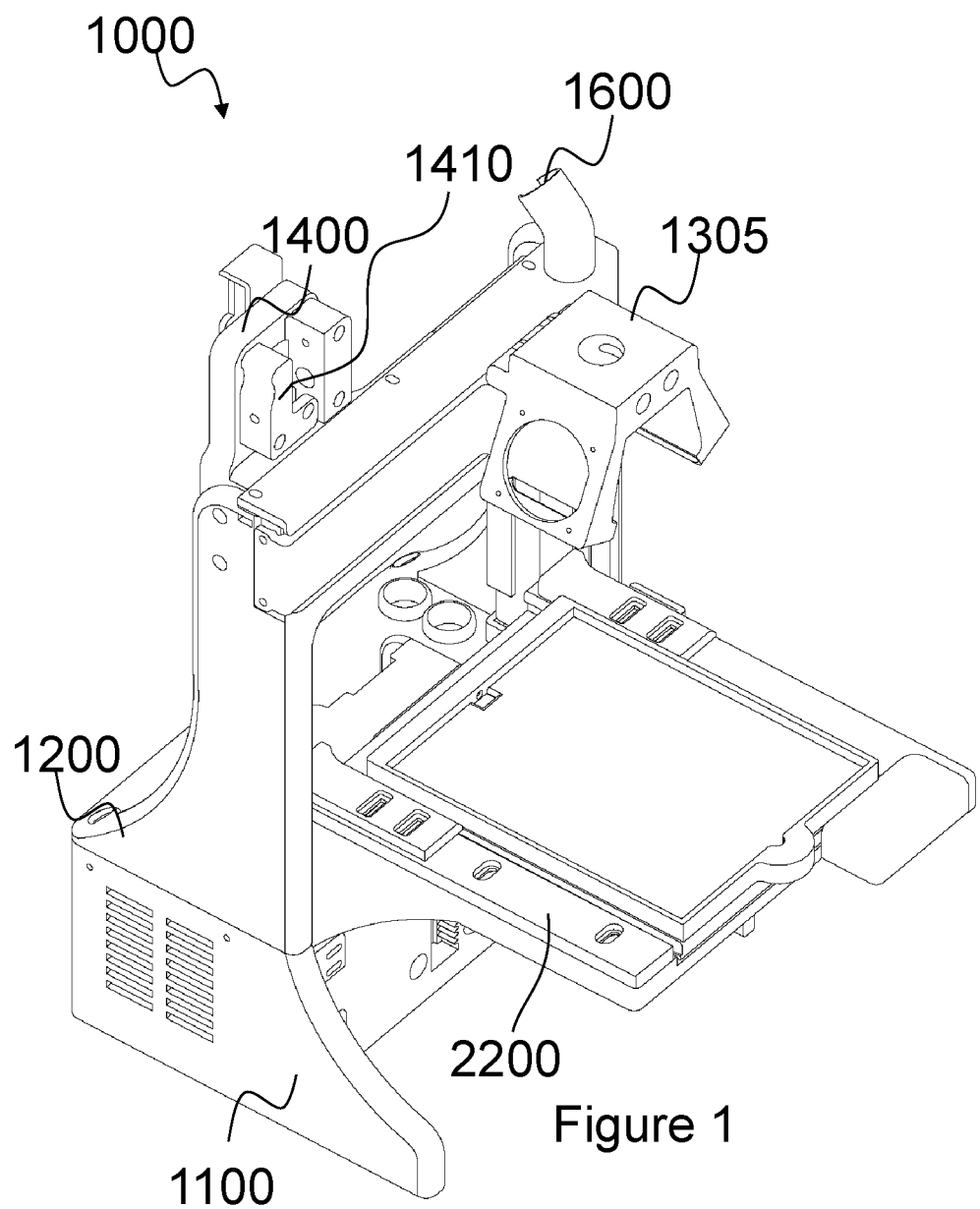
FIG. 1 is a perspective view of an exemplary first set of parts provided in a single material for providing a three-dimensional (3D) printer in accordance with the teachings of the present invention.
Figure 2:
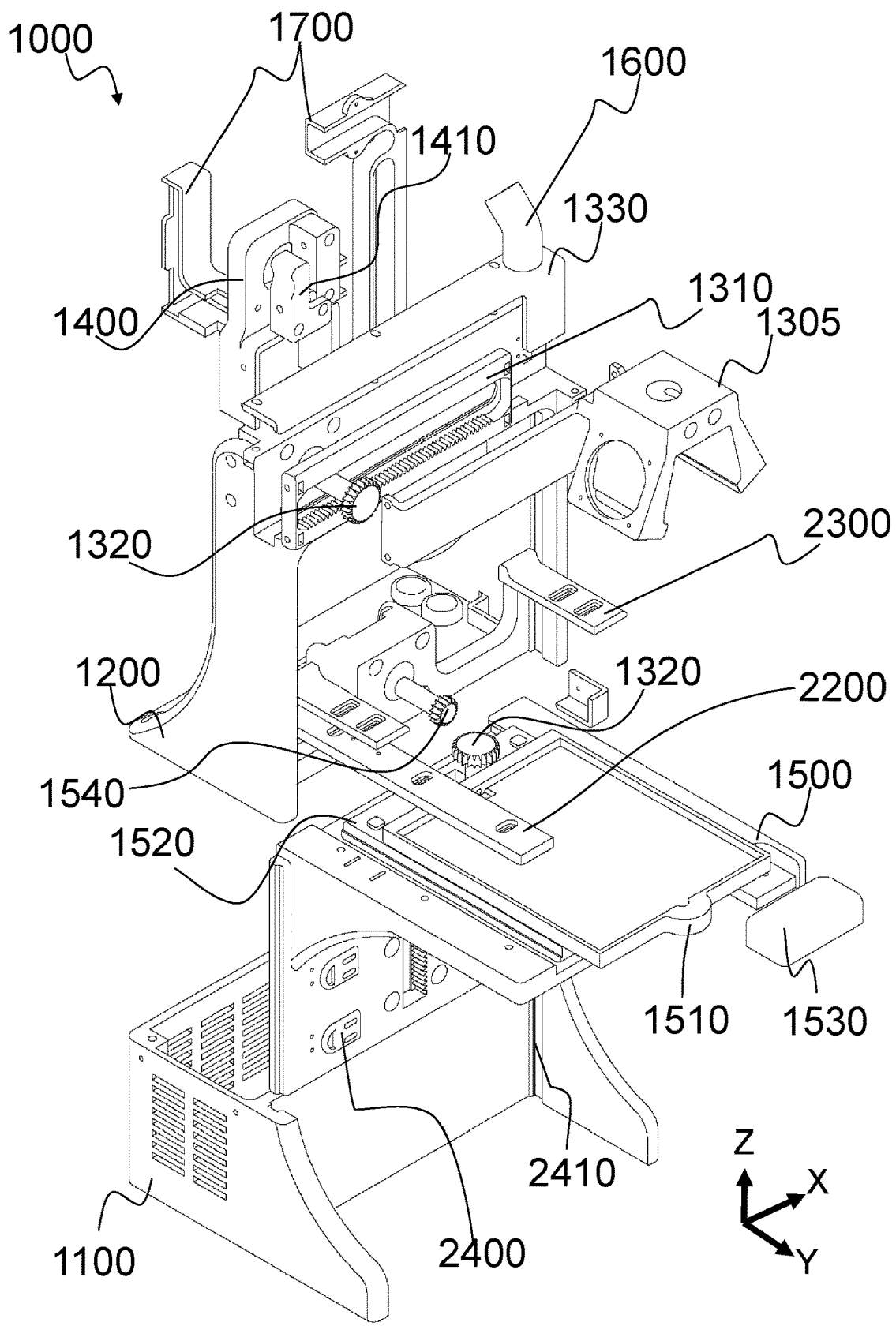
FIG. 2 is an exploded perspective view of the exemplary first set of parts in accordance with the teachings of the present invention.
Figure 3:
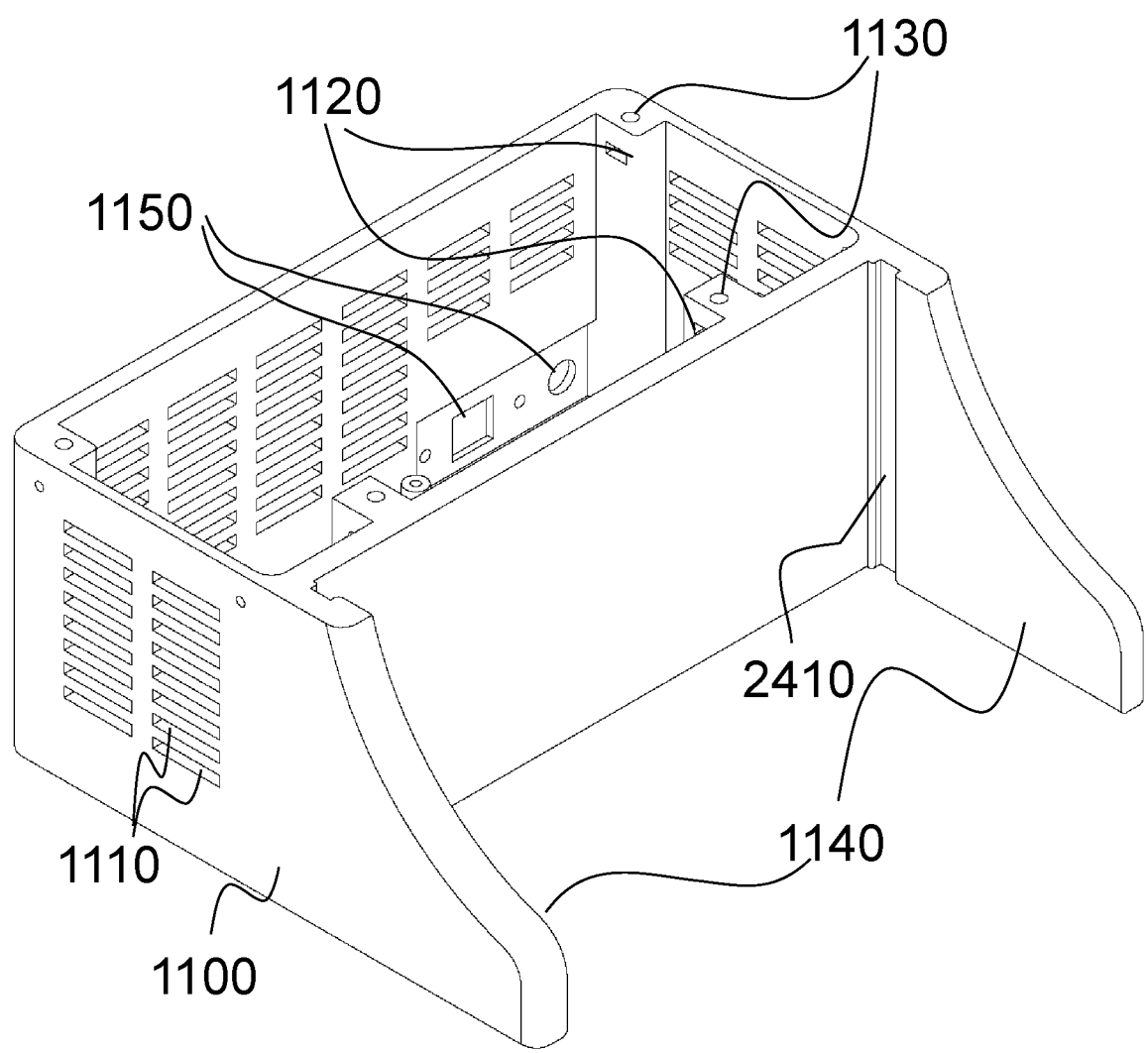
FIG. 3 is a perspective view of an exemplary mono-piece bottom portion of a 3D printer in accordance with the teachings of the present invention.
Figure 4:
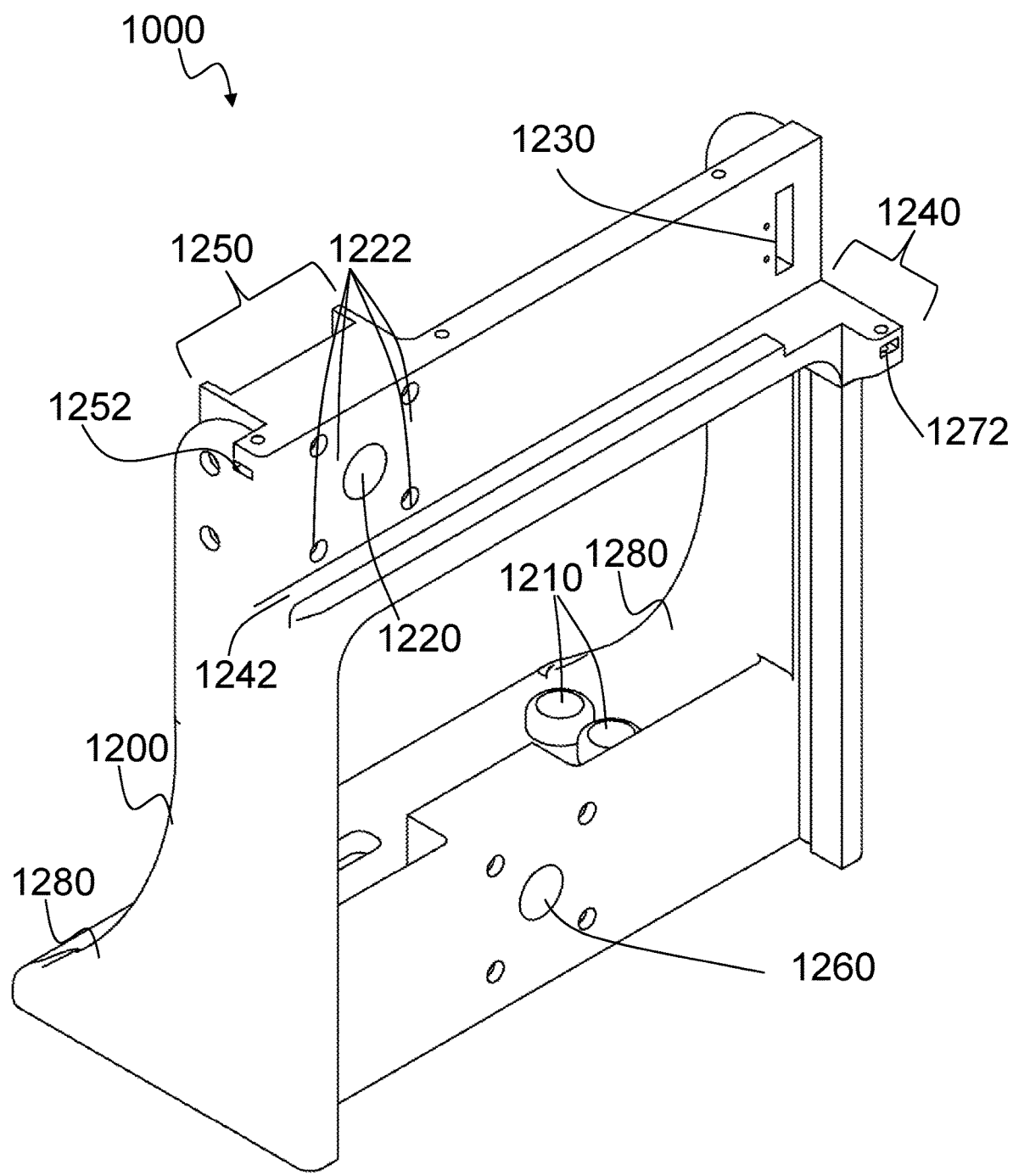
FIG. 4 is a perspective view of an exemplary mono-piece top portion of a 3D printer in accordance with the teachings of the present invention.
Figure 5:
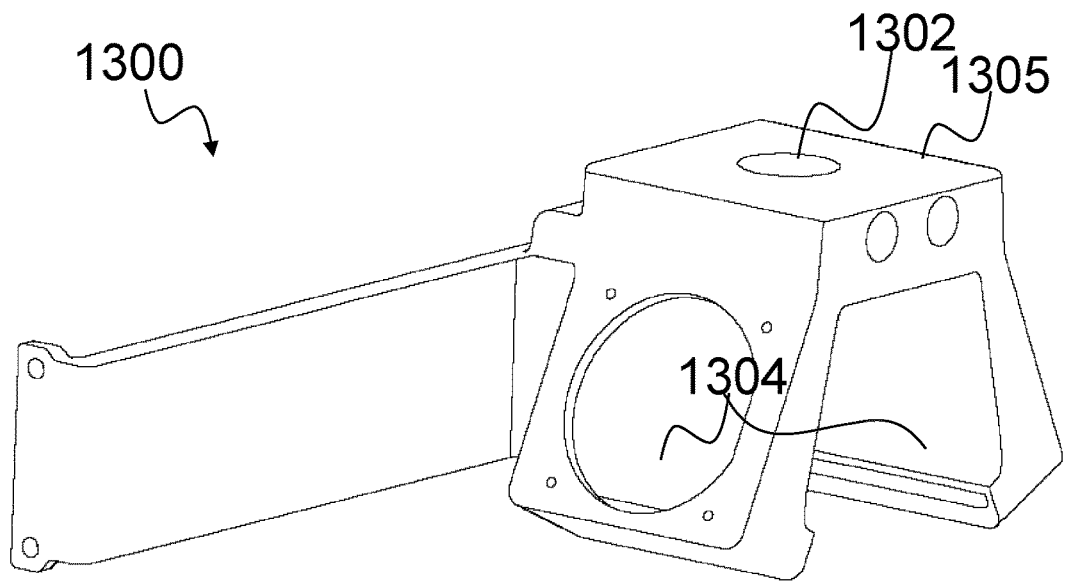
FIG. 5 is a perspective view of an exemplary mono-piece hot-end holder of a 3D printer in accordance with the teachings of the present invention.
Figure 6:
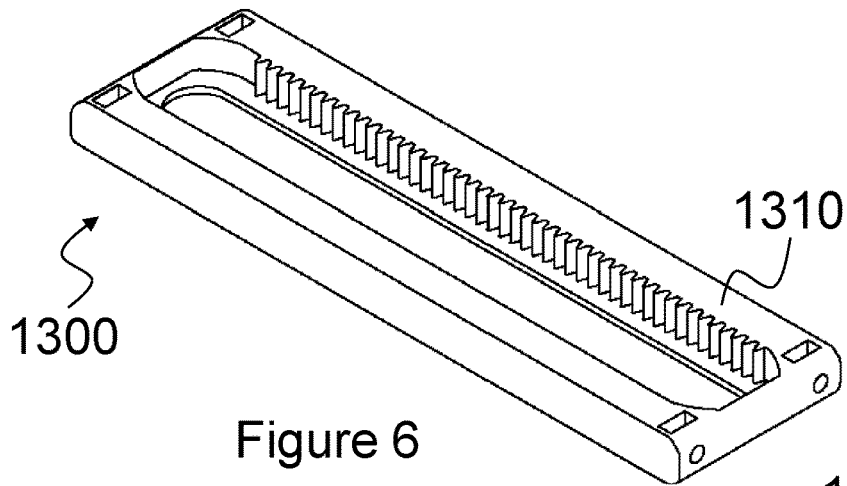
FIG. 6 is a perspective view of an exemplary rack portion of the x-axis of a 3D printer in accordance with the teachings of the present invention.
Figure 8:
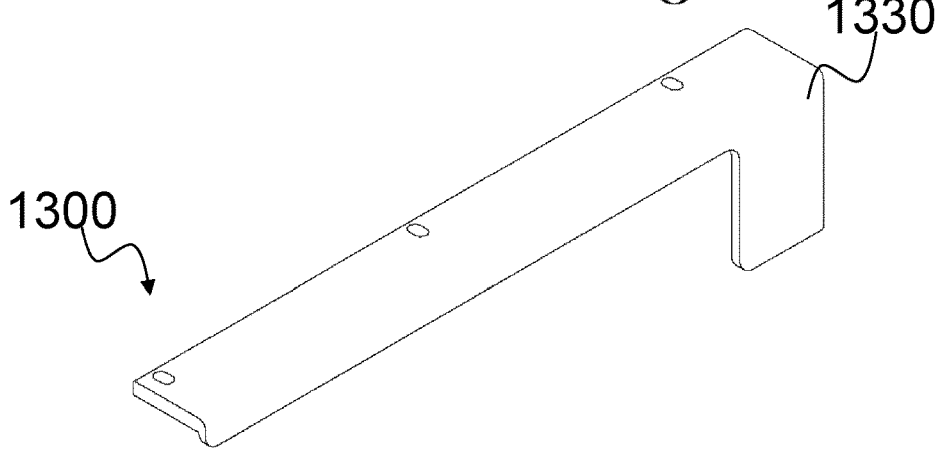
FIG. 8 is a perspective view of an exemplary cover for the rack and pinion of the x-axis of a 3D printer in accordance with the teachings of the present invention.
Figure 7:
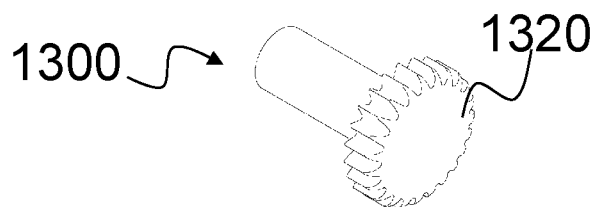
FIG. 7 is a perspective view of an exemplary pinion portion of the x-axis and/or y-axis of a 3D printer in accordance with the teachings of the present invention.
Figure 9A:
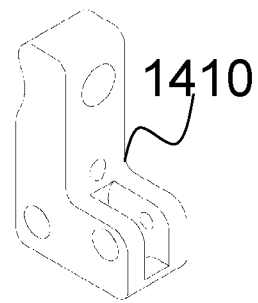
FIGS. 9A and 9B, together referred to as FIG. 9, are perspective views of an exemplary filament extrusion mechanism of a 3D printer in accordance with the teachings of the present invention.
Figure 9B:
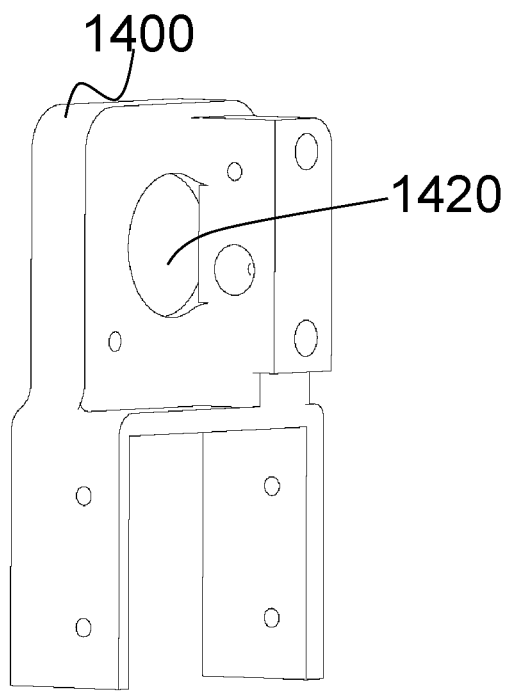
Figure 12:
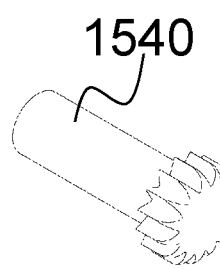
FIG. 12 is a perspective views of an exemplary z-axis pinion of a 3D printer in accordance with the teachings of the present invention.
Figure 13:
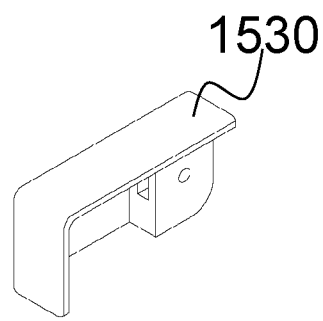
FIG. 13 is a perspective views of an exemplary y-axis limit-switch cover of a 3D printer in accordance with the teachings of the present invention.
Figure 11:
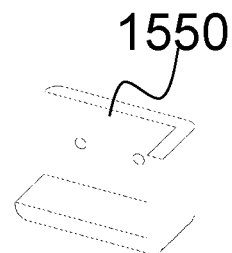
FIG. 11 is a perspective views of an exemplary z-axis limit-switch cover of a 3D printer in accordance with the teachings of the present invention.
Figure 14:
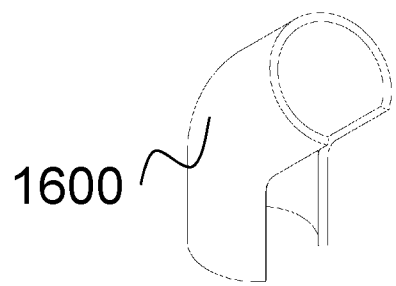
FIG. 14 is a perspective views of an exemplary wire cover of a 3D printer in accordance with the teachings of the present invention.
Figure 10A:
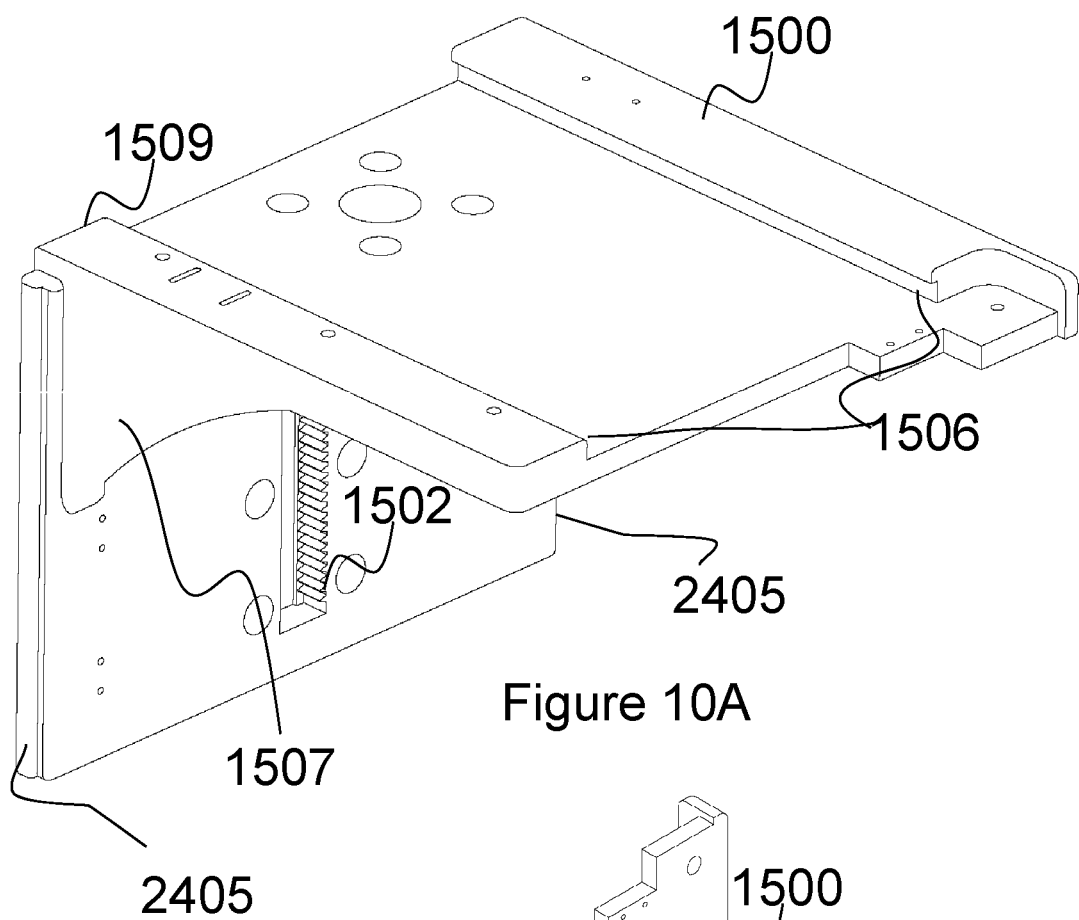
FIGS. 10A and 10B, together referred to as FIG. 10, are perspective views of an exemplary z-axis and specimen holder of a 3D printer in accordance with the teachings of the present invention.
Figure 10B:
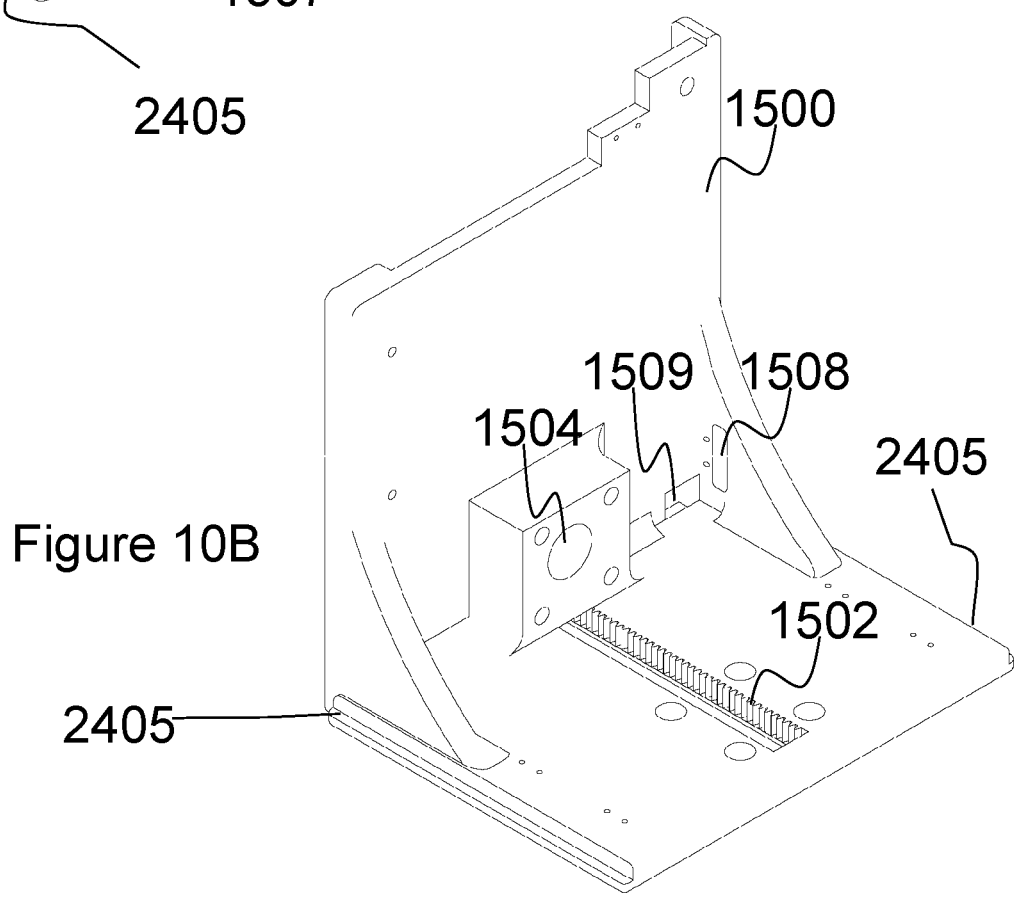
Figure 15A:
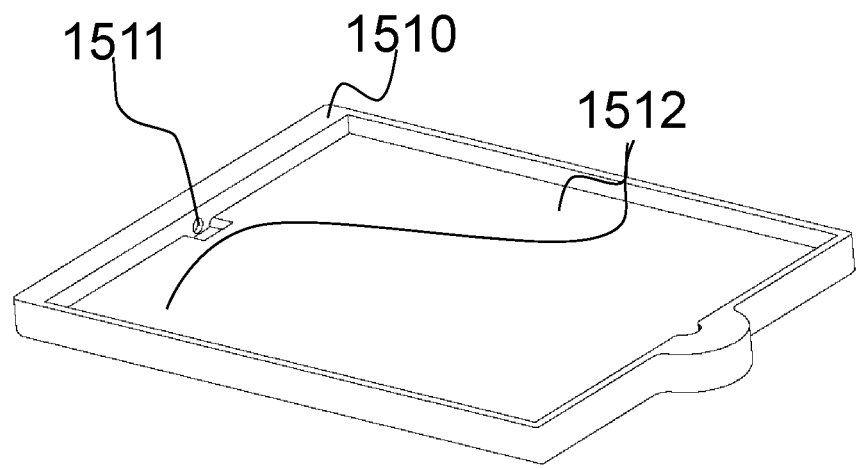
FIGS. 15A and 15B, together referred to as FIG. 15, are perspective views of an exemplary receiver tray of a 3D printer in accordance with the teachings of the present invention.
Figure 15B:
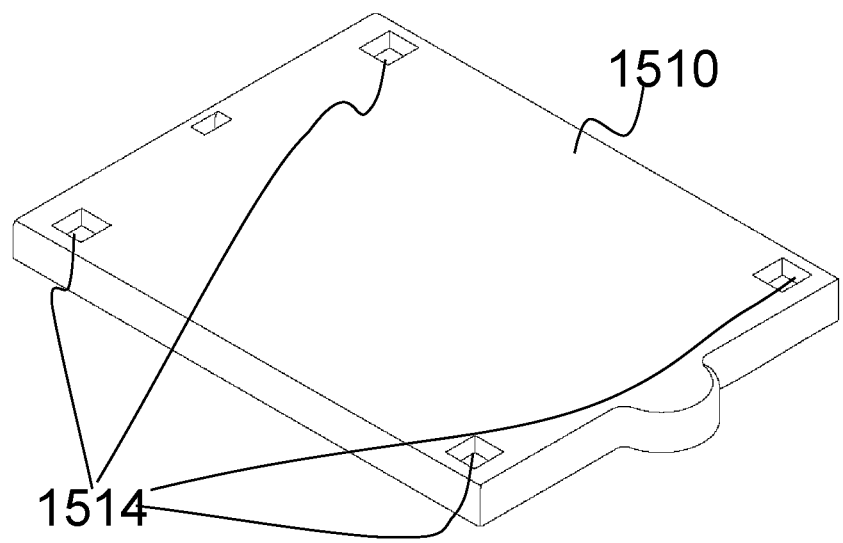

Embodiments of the present invention are directed to a set of parts, or a kit comprising one or more sets of parts, for building a three-dimensional (3D) printer (or an additive manufacturing device), a 3D printer and, in other embodiments, a method for procurement and a method for assembly of a 3D printer. In one embodiment, all moving and structural parts of the 3D printer are designed to be 3D printed by a manufacturing device (not shown) except the specimen receiving plate. Skilled persons will have recognized that the moving parts do not comprise motors or fans, but rather refer to the portions of the 3D-printer that move relative to one another. More specifically, as can be readily appreciated, electrical, electronic, motor, extruding systems and hot ends are in non-3D printed material. The specimen receiving plate is made of a material that resists and does not melt or does not otherwise permanently adhere to the specimen being extruded. The temperature-resistant material of the specimen receiving plate could, for instance, be glass or acrylic glass. For instance, all moving and structural parts of the 3D printer except the specimen receiving plate may be made of a single material with regards to physical properties such as phase reversibility characteristics. The single material may represent variations of slightly different compositions presenting the same or sufficiently close physical properties to be used in a given manufacturing device, as will be readily apparent to skilled persons (e.g., characteristics that fit the requirements of a manufacturing 3D printer, of a laser cutter machine and/or of a molding apparatus, etc.). For instance, the single material may be provided in different colors. It should be appreciated that having all moving and structural parts of the 3D printer except the specimen receiving plate made of the single material necessitates that movement controlling mechanisms along the three (3) axes be made of the single material. The technical solution to the challenge presented by this exemplary set of embodiments is to use three rack and pinion mechanisms along the three axes of movement, which in turn requires that two of the three rack and pinion mechanisms be provided on inter-moving parts at 90° from one another. The unintuitive three rack and pinion mechanisms solution is necessary as the usual threaded-rod mechanism along the z-axis and timing belt and pulley mechanisms along the x axis and y axis comprise parts that cannot be provided in the single material. The moving and structural parts of the 3D printer may further be partly or completely molded or otherwise manufactured in the single material (e.g., using laser-cutting equipment).

In other embodiments, all structural parts and most moving parts of the 3D printer are designed to be 3D printed by a manufacturing device (not shown) except the specimen receiving plate and one or more pinions of rack and pinions mechanisms are provided in more durable material (e.g., metal) and/or the z-axis movement is provided using non-3D printed threaded rods and associated conventional hardware. In all the different embodiments, in order to be functional once assembled, the parts of the 3D printer need to allow positioning of a hot end at a definite 3D location therewithin, with sufficient precision, considering the expected use-case of the 3D printer.

In other embodiments, most structural parts and most moving parts of the 3D printer are designed to be 3D printed by a manufacturing device (not shown) and a complementary set of parts are pre-cut or pre-manufactured, e.g., using laser cutting apparatus and/or molding apparatus. The parts to be 3D printed by a manufacturing device are designed for the single material as discussed above. However, the complementary set of parts may comprise parts of different material and/or of material selected based on manufacturing technique. For instance, laser cutting is more efficient for manufacturing of small number of flat, thin wood parts while molding is more efficient for larger scale production of relatively large parts. Skilled persons will readily understand how to adapt the teachings of the present invention to such mixed-material configurations.

In all the different embodiments, in order to be functional once assembled, the parts of the 3D printer need to allow positioning of a hot end at a definite 3D location therewithin, with sufficient precision, considering the expected use-case of the 3D printer.

Reference is now made to the drawings in which FIG. 1 shows a perspective view of an exemplary first set of parts 1000 provided at least partially in a single material for assembling a three-dimensional (3D) printer in accordance with the teachings of the present invention. In order to be functional, the first set of parts 1000 once assembled need to provide a structure that can position a hot end at a definite 3D location within a 3D printer, with sufficient precision. For greater certainty, a z-axis is defined in the following description along the height of the depicted example of FIG. 1, an x-axis is defined along the width of the depicted example of FIG. 1 and a y-axis is defined along the depth of the depicted example of FIG. 1. Reference is also concurrently made, in addition to FIG. 1, to FIGS. 2 to 17, which each shows at least one part from the exemplary first set of parts 1000.

The single material may be a thermoplastic. Skilled persons will recognize that the reference to "single material" does not refer to the color or other aesthetical characteristics, but to technical specifications of the single material. The "term thermoplastics" applies to polymers that reversibly change phase with temperature. While keeping within a boundary of temperatures, these phase changes can be done safely and the material returns to its original solid state after cooling, without any significant alteration in its original properties. Advantageously, PLA (polylactic acid) thermoplastic may be used as the single material. Different kinds of thermoplastic may also be used and still be considered a single material. Skilled persons will recognized that other types of thermoplastics (PHA, ABS, HDPE, etc.) may also be used depending on the technology used to manufacture the set of parts 1000. Furthermore, skilled persons will recognize that other material than thermoplastic that would exhibit temperature-based phase reversibility or other phase reversibility properties may also be used in other embodiments provided that such material can be extruded or otherwise selectively positioned using a hot end or other distribution mechanism having similar properties (e.g., that is adapted in terms of size and other usability characteristics for domestically-used manufacturing device).

The single material may be for all depth-affected components while flat structural elements may be provided in one or more other materials (e.g., wood). Skilled person will readily acknowledge that parts from different materials and/or manufactured by different apparatuses and/or techniques may be provided together (e.g., laser-cut parts and molded parts).

In one embodiment, an enclosure, or main structure, of the 3D printer is provided by a bottom frame 1100 and a main frame 1200 respectively printed in with a maximum of 0.02" (~0.5 mm) and 0.01" (~0.25 mm) tolerancing, preferably with a maximum of 0.01" (~0.25 mm) and 0.001" (~0.025 mm), considering that the dimensions of the bottom frame 1100 and main frame 1200, among others, when assembled (e.g., approximately 11" high by 7½" wide by 7½" deep). The tolerancing selection is important to avoid tolerance stackup, which would not allow construction of the 3D printer or would provide a 3D printer of insufficient precision (e.g., for continued operation without repair). Tolerancing values are also selected accordingly for other parts of the 3D printer. Skilled persons will readily recognize that other tolerancing values could be determined without affecting the teachings of the present invention. Notably, scaling up or scaling down of the bottom frame 1100 and main frame 1200 will inevitably have to be considered when setting adequate tolerancing. The bottom frame 1100 and the main frame 1200 could be provided in a single part, which may require a larger manufacturing device. Likewise, the bottom frame 1100 and the main frame 1200 could be further divided into more parts, which would require careful selection of the tolerancing and/or a more precise manufacturing device. When a junction is provided between different parts of the enclosure, attention should be given to the junction, e.g., to avoid causing friction during use as moving components are slidably engaged in one or more groves of the enclosure. The design of the first set of parts 1000 is made to avoid or limit the number of junction(s) over which moving part(s) are expected to travel (e.g., between different portions of a functionally continuous groove), thereby preventing friction which could eventual prevent or impede proper movement (s). The tolerancing of the joined parts should be selected correctly and/or shimming of the joined parts after manufacturing (e.g., using additional parts of the single material, locknut(s) and/or spring-loaded screw(s), etc.) should be performed to ensure proper alignment of the joined parts. Negative adjustment (e.g., removing a certain thickness in excess of the tolerancing or combined tolerancing of the joined parts) may also be made on one or more of the joined parts to ensure that no friction will be caused by a movement thereover. When nuts and bolts are expected to be used between different parts, corresponding fitting holes may be provided slightly larger than the diameter of the bolt to allow for minor adjustments at the time of assembly.

In some embodiments, an LCD screen support (not shown) may be provided on the enclosure. For instance, the bottom frame 1100 may further comprise the LCD screen support between the two front legs, inclined at about 45 degrees. Additional opening(s) may be made to the bottom frame 1100 for routing additional cables towards the LCD screen support. An LCD screen positioned on the LCD screen support could be used to input certain or all commands to the 3D printer. The 3D printer may be made independent from a computer when the LCD screen is used in combination with a memory card reader.

In the depicted example of FIG. 1, the bottom frame 1100 is provided as a base of the enclosure of the 3D printer. The bottom frame 1100 is also for hosting electrical components (not shown) such as a power switch, a USB port, a memory card reader and/or a microcontroller card, etc. An AC and/or DC power input port is also expected. For instance, a transformer (e.g., 120 VAC to 24, 12 and/or 5 VDC) may be expected to be housed within the bottom frame 1100 and/or one or more VDC input may also be provided. Typically, only one VDC input is expected to be provided. However, as skilled people will recognize, the microcontroller or another of the hosted electrical components may be programmed to select the most appropriate of the power input(s) when more than one is received. While it is not expected to be the most viable source of power considering the typical time taken by a 3D printer to complete a task, batteries or other portable power devices could also be used as a main source or as a temporary backup source of power (e.g., to avoid cancelling a job in progress). Skilled persons will recognize that, while the bottom frame 1100 is to be dimensioned considering these aspects, they do not affect the teachings of the present invention. One or more input/output openings 1150 are therefore provided through the bottom frame 1100. The electrical components are not made of the same material as the bottom frame 1100. Yet, electrical components are necessary for the 3D printer to be built from the set of parts 1000, to receive power and to obtain a 3D model corresponding to a specimen to be manufactured by the 3D printer (e.g., read from a memory card and/or received from a computer, e.g., via a USB interface, a parallel interface, a network interface (e.g., Ethernet connection over wired or wireless medium), etc.).

The bottom frame 1100 of the enclosure may provide openings 1110 on its surrounding for allowing ventilation of the components to be hosted therewithin. One or more slots 1120 may be provided to fixably receive a nut that will be engaged once a screw is inserted in a corresponding hole 1130 to maintain a main frame 1200 thereabove. Similar slots 1252, 1272 (and others not shown) may also be provided in other parts from the first set of parts. Other structural guides and/or screw holes (not shown) may be provided in the bottom frame 1100 to secure the electrical components therewithin. Skilled persons will readily understand that other manners of assembling/designing the bottom frame 1100 (e.g., the shape/length of the supporting legs 1140, etc.) may be used without affecting the teachings of the invention.

The main frame 1200 of the enclosure comprises one or more holes (not shown) for receiving screws inserted in the corresponding holes 1130. The main frame 1200 also comprises one or more functional hole 1210 for allowing cables to run from the bottom frame 1100 to other electrical components (not shown) of the 3D printer when assembled. The main frame 1200 of the enclosure holds an x-axis component 1300 of the set of parts 1000 in place when the set of parts 1000 is assembled into the 3D printer. A motor socket 1220 is provided for receiving a x-axis motor (not shown) for driving a pinion 1320 in a rack 1310 and pinion 1320 assembly for the x-axis component 1300 of the 3D printer. Screw holes 1222 surround the socket 1220 for maintaining the motor thereto upon assembly. Similar screw holes are also depicted on in different views surrounding others exemplary sockets 1260, 1420 and 1504 for the same purpose. Skilled persons will note that the screw holes specification will be linked to specifications of a motor to be maintained thereby. The socket 1220 is provided on one side of the main frame 1200 (depicted on the left side) while a limit-switch opening 1230 is provided on the other side of the mainframe 1200 (depicted on the right side) for allowing maximum movement length of the x-axis component 1300 along the x-axis. Skilled persons will readily understand that other manners of assembling/designing the main frame 1200 (e.g., the shape/length of the supporting legs 1280, etc.) may be used without affecting the teachings of the invention.

The rack 1310 of the x-axis component is maintained against the main frame 1200 on a shelf 1240 by a groove cover 1330 of the x-axis component screwed thereover. A groove 1242 is formed by the shelf 1240 in the main frame 1200 and the groove cover 1330 for allowing the rack 1310 to move therealong when the pinion 1320 rotates. A hot end holder 1305 of the x-axis component is fixed on the rack 1310 thereby determining an x-axis coordinate of the definite 3D location as a function of the rotation of the pinion 1320 and the position of the limit-switch opening 1230 when the set of parts 1000 is assembled. In the depicted embodiment, the hot end holder 1305 is connected to the x-axis rack 1310, e.g., by bolts and nuts on each side. As skilled person will appreciate, other bolts and nuts may be used to assemble other portions of the 3D printer. Other fastening mechanisms could also be used without affecting the teachings of the present invention. Structural elements of the x-axis component 1300 are the groove cover 1330, rack 1310 and the hot end holder 1305, which maintained on the main frame 1200 of the enclosure when assembled.

In the depicted example, the hot end holder 1305 comprises a hot end socket 1302 for receiving a hot end (not shown) and one or more opening 1304 for receiving corresponding fans (not shown) for controllably (e.g., continuously or selectively) cooling material extruded therefrom. Skilled persons will readily understand that other manners of assembling/designing the hot end holder 1305 (e.g., the shape/length/position of the opening(s) 1304, radius/gear depth of the pinion 1320, etc.) may be used without affecting the teachings of the invention.

In the depicted example, the main frame 1200 of the enclosure also provides a shelf 1250 for supporting a filament extrusion mechanism 1400 for feeding a raw material filament at a measured pace towards the hot end. A motor socket 1420 is provided for allowing a feed motor (not shown) to frictionally engage the raw material filament (e.g., using a drive gear and a bearing). A lever 1410 fixed to the filament extrusion mechanism 1400 allows to maintain the raw filament wire against the motor using a biasing means (not shown, such as a spring). When the feed motor controllably rotates in the assembled 3D printer in use, the raw material filament advances at a controlled pace towards the hot end. The filament is routed from the filament extrusion mechanism 1400 to the hot end within a tube (not shown). Skilled persons will readily understand that other manners of assembling/designing the filament extrusion mechanism 1400 may be used without affecting the teachings of the invention.

Figure 25:
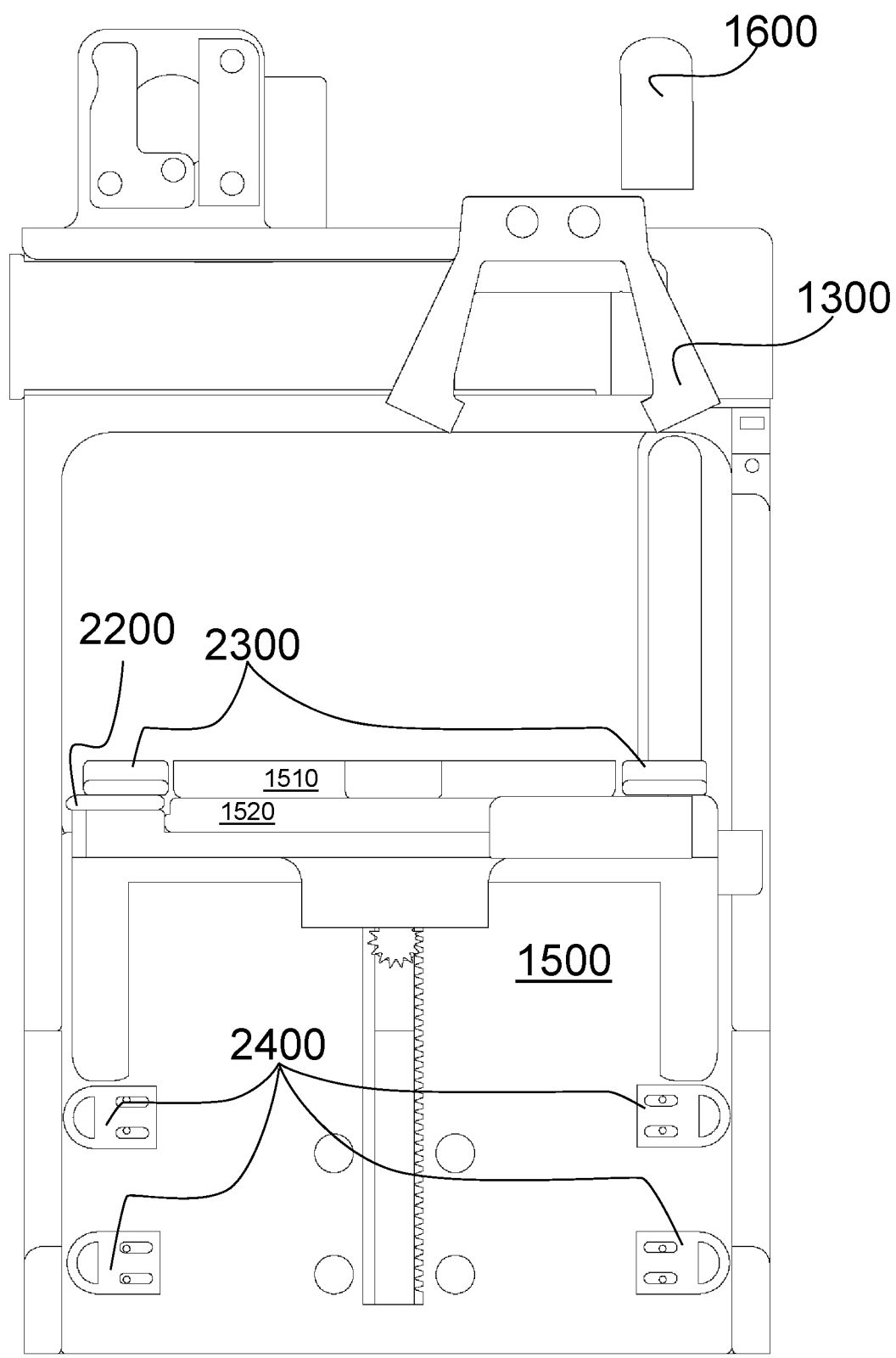
FIG. 25 is a front view of an exemplary 3D printer assembled in accordance with the teachings of the present invention.

A z-axis component of the set of parts 1000 moves a specimen holder component 1500 along the z-axis, thereby determining a z-axis coordinate of the definite 3D location. In the depicted example, the main frame 1200 provides a motor socket 1260 for receiving a z-axis motor (not shown) for driving a pinion 1540 in a rack 1502 and pinion 1540 assembly of the z-axis component of the 3D printer when assembled. n the depicted example, a side portions 2405 of the specimen holder component 1500 slides along the enclosure over the bottom frame 1100 and the main frame 1200 in a groove 2410 provided therealong. Optional adjustments tabs 2400 (also depicted in isolation on FIG. 24) may be provided to limit potential rotation of the specimen holder component 1500 along the y axis and/or limit potential movements of the specimen holder component 1500 along the x-axis (e.g., two on each side 2405 of the specimen holder component 1500 as depicted on FIG. 25). The adjustments tabs 2400 may be useful to compensate and better adapt to slight differences between the different parts. As can be appreciated, the specimen holder component 1500 partly integrates the z-axis component as it comprises the rack 1502 of the z-axis component. Optionally, the rack 1502 may be provided as a distinct part in the set of parts 1000 (e.g., similar to the rack 1310) positioned and maintained in the specimen holder 1500. Skilled person will recognize, however, that providing a single component comprising the rack 1502 and the side portions 2405 minimize the sources of imprecisions and tolerance stack up, which therefore minimizes the need for adjustments during assembly of the 3D printer. Structural elements of the z-axis component are provided by vertical portions of the specimen holder component 1500 maintained along the enclosure in the groove 2410.

In the depicted example, the main frame 1200 also comprises a screw hole and nut slot 1272 for receiving a z-axis limiter (not shown) for engaging a corresponding z-axis limit-switch of the set of parts 1000 from the specimen holder component 1500 when assembled.

Figure 22:
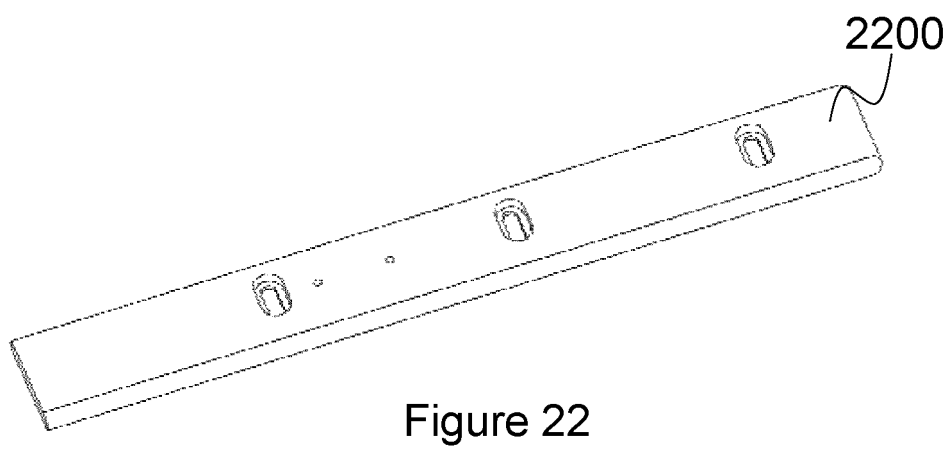
FIG. 22 is a perspective view of an exemplary removable groove cover in accordance with the teachings of the present invention.

A y-axis component moves a sliding plate 1520, on the specimen holder component 1500, along the y-axis, thereby determining a y-axis coordinate of the definite 3D location. The specimen holder component 1500 comprises a motor socket 1504 for receiving a y-axis motor (not shown) for driving a pinion (similar to 1320, e.g., which may be provided in duplicate on the set of parts 1000) in a rack 1522 and pinion 1320 assembly of the y-axis component of the 3D printer. The rack 1522 is part of the sliding plate 1520 maintained on the specimen holder component 1500 in a groove 1506 over side portions 1526 and 1528 of the sliding plate 1520. The groove 1506 limits potential z-axis movement of the sliding plate 1520 over the specimen holder component 1500 and/or limits potential rotation of the sliding plate 1520 along the z-axis. The groove 1506 may be provided integrally with the specimen holder component 1500, e.g., on both sides thereof. In order to provide a better assembly and/or better adjustment and further limit the potential z-axis movement of the sliding plate 1520, a removable groove cover 2200 (also depicted in isolation on FIG. 22) may further be added along the sliding plate 1520 thereby forming the groove 1506 on one side portion 1526 of the sliding plate 1520. The removable groove cover 2200 may be useful to compensate and better adapt to slight differences between the different parts. As can be appreciated, when three rack and pinion mechanisms (1310, 1320;

1502, 1540 and 1522, 1320) are provided as depicted, two of the three (1502, 1540 and 1522, 1320) are provided on inter-moving components. Said differently, all parts of one of the three rack and pinion mechanisms move together along an axis controlled by another one of the three rack and pinion mechanisms. With particular reference to the depicted example, when assembled, the specimen holder component 1500 moves relative to the main frame 1200 along the z-axis and the x-axis component 1300 moves relative to the main frame 1200 along the x-axis. In order to control the definite 3D location when the 3D printer is assembled from the set of parts 1000, the y-axis component moves along the y-axis, but also moves altogether with the specimen holder component 1500 along the z-axis. A z-axis limit-switch opening 1508 and an opening 1509 allow necessary cables for the y-axis motor, the y-axis limit-switch and the z-axis limit-switch (i.e., which move along with the specimen holder component 1500) to be properly routed without impeding controlled movements in the 3D printer when assembled and in use. Structural elements of the y-axis component are provided by horizontal portions of the specimen holder component 1500 comprising the sliding plate 1520 maintained horizontally along the specimen holder component 1500 in the groove 1506.

In the depicted example, the sliding plate 1520 comprises protuberances 1524 matching notches 1514 on a lower surface of a removable receiver tray 1510 for ensuring proper positioning and alignment thereof. Alignment tabs 2300 (also shown in isolation on FIG. 23) may optionally be provided over the specimen holder component 1500 to limit rotation along the z-axis and/or limit potential movements of the removable receiver tray 1510 along the x-axis when positioned over the sliding plate 1520. The adjustments tabs 2300 may be useful to compensate and better adapt to slight differences between the different parts. The removable receiver tray 1510 is for receiving a specimen receiving plate (not shown) which is typically glass-made or acrylic-glass-made. Lateral supports 1512 may be provided to directly maintain the specimen receiving plate in the removable receiver tray 1510, thereby limiting the potential effect of an imperfect upper surface of the removable receiver tray 1510 caused by tolerancing during manufacturing thereof. For instance, should the removable receiver tray 1510 present a slightly upward convex shape, the specimen receiving plate might be unsteadily supported, leading to imprecisions of the 3D printer when in use. Alternatively, or in addition, a bolt and nut hole 1511 may also be provided to receive a bolt and a nut for steadily maintaining specimen receiving plate in place. Skilled persons will readily understand that other manners of assembling/designing the specimen holder component 1500 (e.g., the shape/length/position of supporting legs 1507, radius/gear depth of the pinion 1540, etc.) may be used without affecting the teachings of the invention.

A back wiring enclosure 1700 is shown on the depicted example for routing cables from the bottom assembly towards the filament extrusion mechanism 1400, the x-axis limit-switch and the x-axis motor. The back wiring enclosure 1700 may, for instance, prevent to the wiring from impeding or otherwise affecting movements when the assembled 3D printer is in use. A wire guide 1600 is shown on the depicted example for routing cables from behind without impending movements in the 3D printer and/or kinking the cables when assembled and in use. Skilled persons will readily understand that some parts in the first set of parts 1000 are optional (e.g., the back wiring enclosure 1700 and the wire guide 1600) and may be avoided without affecting the teachings of the invention.

Figure 18:
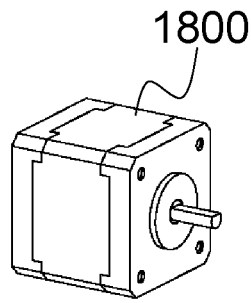
FIG. 18 is a perspective view of an exemplary electric motor compatible with a 3D printer in accordance with the teachings of the present invention.

FIG. 18 shows an exemplary motor 1800 compatible with a set of parts for assembling a 3D printer in accordance with the teachings of the present invention. In the preferred embodiment, four units of the motor 1800 may be used, or provided together, with the set of parts 1000 for all motorized purposes of the 3D printer when assembled and in use. For instance, the stepper motor Kysan 1124090/Nema 17 may be used. Motors of different types and/or different motorization means may be used, as skilled persons will acknowledge, without affecting the teachings of the invention by performing customary modifications to the location of motor sockets 1220, 1260, 1504. In some embodiments, the location of motor sockets 1220, 1260, 1504 is selected considering the effect of the motor on the center of gravity of the 3D printer when assembled and, for instance, may be selected so that the overall effect of all the mounted motors when assembled is close to the center of gravity (e.g., counter-balancing each other), which provides for improved balance of the assembled 3D printer.

Figure 19:
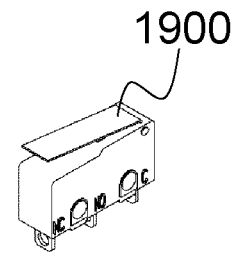
FIG. 19 is a perspective view of an exemplary limit-switch compatible with a 3D printer in accordance with the teachings of the present invention.

FIG. 19 shows an exemplary limit-switch 1900 compatible with a set of parts for assembling a 3D printer in accordance with the teachings of the present invention. In the preferred embodiment, three units of the limit-switch 1900 are used, or provided together, with the set of parts 1000 for all limit-switch purposes of the 3D printer when assembled and in use. Calibration of the three axes may be performed by using the limit-switches 1900, thereby ensuring that tolerancing of the different parts is correctly considered. For instance, the limit-switch Microswitch/SS-3GL13PT may be used. Other calibration means and methods may be used, as skilled persons will acknowledge, without affecting the teachings of the invention.

Figure 20:
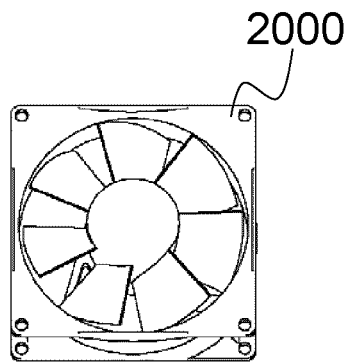
FIG. 20 is a perspective view of an exemplary fan compatible with a 3D printer in accordance with the teachings of the present invention.

FIG. 20 shows an exemplary fan 2000 compatible with a set of parts for assembling a 3D printer in accordance with the teachings of the present invention. In the preferred embodiment, three units of the fan 2001 are used, or provided together, with the set of parts 1000 for all ventilation purposes of the 3D printer when assembled and in use. For instance, two 40 mm fans XJ12B6020H laterally and one 30 mm XYJ24B3010H may be used facing the hot end. Other cooling configurations may of course be used, as skilled persons will acknowledge, without affecting the teachings of the invention.

Figure 21:
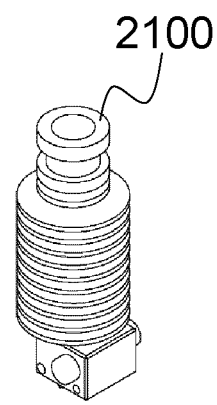
FIG. 21 is a perspective view of an exemplary extruder/hot end assembly compatible with a 3D printer in accordance with the teachings of the present invention.

FIG. 21 shows an exemplary hot end 2100, without the thermistor, the Bowden add-on and the heated bloc 2100, compatible with a 3D printer in accordance with the teachings of the present invention.

Skilled persons will readily understand that the design of some or all of the first set of parts 1000 may be modified to accommodate various types of motors 1800, switches 1900, fans 2000 and/or hot ends 2100 without affecting the teachings of invention.

The use of the rack and pinion solutions for at least the x-axis and y-axis and optionally the z-axis has different exemplary advantages. For instance, the rack and pinion solution avoids the need for a transmission (strap, pulleys, belts, threaded rods, ball bearings, or else), which limits the number of moving parts and also ensures that tolerancing stackup, which may occur when different interacting parts are involved in the transmission.

In optional embodiments, a complete rack and pinion mechanism may be designed to be 3D printable in a single part with a breakable point of attachment. For instance, the pinion may be initially positioned within a dead range of the rack with a breakable point of attachment. A cover may also be printed over the rack and pinion, thereby further limiting the risk of tolerance stackup. However, diagnosis and eventual repair of a broken rack and/or pinion may be made more difficult.

A uniform gear depth (e.g., 0.22" (about 5.6 mm) in the depicted example) may be selected considering the tolerancing of the 3D printer that may be used for manufacturing the set of parts 1000.

A filament spool (not shown) may be added onto the main frame 1200, or another non-moving part of the set of parts 1000 for convenience.

Skilled persons will recognized that the exemplary design of FIGS. 1 to 25 can be stretched up to provide a larger 3D printer or stretched down to provide a smaller 3D printer. Skilled persons will readily recognize the stretching limits by considering the material thickness and resistance and/or by routine testing.

As an optional feature, the x-axis rack 1310 may be adapted to mount different tools or heads (not shown), which may allow for mixing different materials in additive manufacturing or using different tools on the specimen in subtractive manufacturing. For instance, different mounts for heads may be provided sideways along the x-axis, along the y-axis or along the x-axis and y-axis (e.g., matrix of 4 tools). A rotating mechanism similar to the ones used on a microscope may also be used, allowing an active tool to be positioned at single location. The different heads may be, for instance, different hot end(s), pump(s) (ink, conductive ink, etc.), mill(s), laser(s), cutter(s), grinder(s), component positioner(s), etc.

In some embodiments, conductive ink may be printed on or, preferably, printed within one or more components of the set of parts 1000 at the time of 3D printing. In such instances, the conductive ink may be used to replace one or more wires (e.g., for one or more of the motors 1800, limit-switches 1900, fans 2000, hot ends 2100 and/or other electric or electronic parts).

Some embodiments of the present invention are directed to a three-dimensional (3D) printer for 3D-printing a specimen therewithin, whether or not provided from a set of parts or as a complete apparatus. The 3D printer in accordance with such embodiments comprises a hot end similar to 2100, a controller (not shown) and an enclosure (e.g., comprising the bottom component 1100 and the main component 1200). The controller sets a definite 3D location of the hot end 2100 in relation to the specimen and controls the hot end 2100 for selectively extruding material to 3D-print the specimen. The enclosure 1100/1200 provides a first groove 2410 defining a first plane along a z-axis within the 3D printer. The 3D printer also comprises a hot end holder (which may or may not be similar to the x-axis component 1300), a specimen holder component similar to 1500 and a z-axis motor assembly. The hot end holder is provided on the enclosure 1100/1200 and moves the hot end 2100 along an x-axis within the 3D printer in accordance with instructions received from the controller, thereby determining an x-axis coordinate of the definite 3D location. The specimen holder component 1500 is maintained in the first groove 2410 of the enclosure 1100/1200. The specimen holder component 1500 comprises a sliding plate 1520 over which the specimen is 3D-printed by the hot end 2100 and a second groove 1506 defining a second plane along a y-axis within the 3D printer. The first plane and the second plane are perpendicular. The specimen holder component 1500 also comprises a y-axis motor assembly that causes the sliding plate 1520 to slide in the second groove 1506 in accordance with instructions received from the controller, thereby determining a y-axis coordinate of the definite 3D location. The second groove 1506 may be defined strictly by the specimen holder component 1500 and may alternatively be defined by the specimen holder component 1500 on one side and a removable groove cover similar to 2200 on the other side. Removable groove covers could also be used on both sides of the second groove 1506. The z-axis motor assembly is provided on the enclosure 1100/1200 and causes the specimen holder component 1500, together with the z-axis motor assembly, to slide in the first groove 2410 along the first plane in accordance with instructions received from the controller, thereby determining a z-axis coordinate of the definite 3D location. In some embodiments, the first plane and second plane may intersect along an edge 1509 of the specimen holder component 1500 in the x-axis.

The 3D printer may optionally further comprise a removable receiver tray 1510 positioned over the sliding plate 1520. The removable receiver tray 1510 may further comprise a specimen receiving plate (not shown), the specimen being printed thereon.

In some embodiments, the y-axis motor assembly may comprise a y-axis rack and pinion mechanism 1522/1320. The y-axis rack 1522 thereof is integrated in the sliding plate 1520 of the specimen holder component 1500. The y-axis motor assembly may also comprise a y-axis motor similar to 1800, fixably maintained under the specimen holder component in 1504, for controllably rotating the y-axis pinion 1320 of the y-axis rack and pinion mechanism in accordance with instructions received from the controller.

In some embodiments, the z-axis-motor assembly may comprise a z-axis rack and pinion mechanism 1502/1540. The z-axis rack 1502 thereof is integrated in the specimen holder component 1500. The z-axis-motor assembly may also comprise a z-axis motor similar to 1800, fixably maintained on the enclosure 1100/1200 in 1260, for controllably rotating the z-axis pinion of the z-axis rack and pinion mechanism in accordance with instructions received from the controller.

In some embodiments, the hot end holder comprises an x-axis-motor assembly comprising an x-axis rack and pinion mechanism 1310/1320. The x-axis rack 1310 thereof is slidably engaged in a third groove 1242 of the enclosure 1100/1200 along the x-axis and is solidarized with the hot end 2100 (e.g., through the groove cover 1330 screwed into the enclosure 1100/21200 and the hot end holder 1305 screwed into 1310). The x-axis-motor assembly may also comprise an x-axis motor similar to 1800, fixably maintained on the enclosure 1100/1200, for controllably rotating the x-axis pinion 1320 of the x-axis rack and pinion mechanism in accordance with instructions received from the controller.

In some embodiments, the 3D printer may further comprise an x-axis limit-switch for the hot end holder, a y-axis limit-switch for the specimen holder component and a z-axis limit-switch for the z-axis component. The limit-switches may be similar to 1900 and used for calibrating the definite 3D location within the 3D printer.

In some embodiments, the 3D printer may further comprise specimen holder adjustment tabs 2400 on the specimen holder component 1500 in parallel to the first plane to impede non-z-axis-movements of the specimen holder component 1500 in the first groove 2410.

In some embodiments, the 3D printer may further comprise one or more sliding plate adjustment tabs 2300 over the specimen holder component 1500 in parallel to the second plane to impede non-y-axis movements of the sliding plate component 1520 in the second groove 1506.

Figure 26:
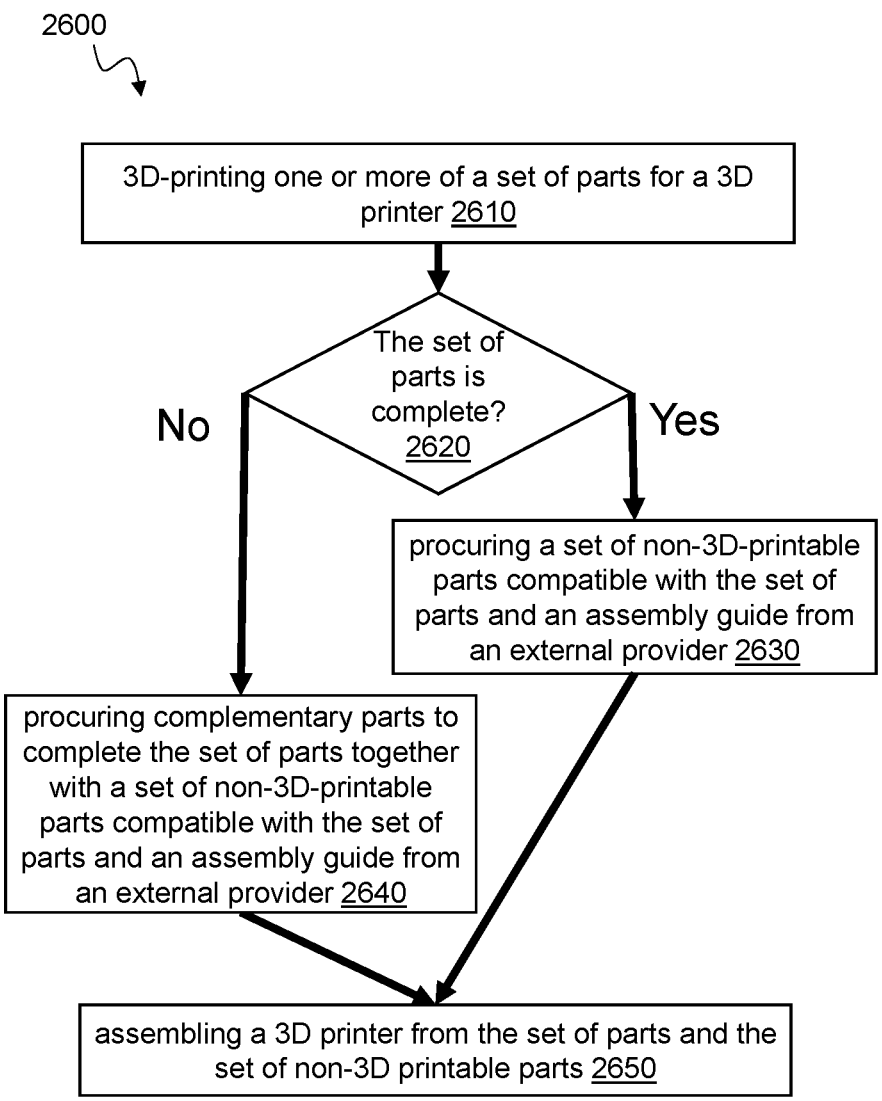
FIG. 26 is a flow chart of an exemplary method in accordance with the teachings of the present invention.

FIG. 26 shows a flow chart of an exemplary method for building a 3D printer from a manufacturing 3D printer. The method comprises, at least once, from a computer in communication with the 3D manufacturing printer, causing instructions stored on a non-transitory electronic computer readable medium to be executed by the manufacturing 3D printer to 3D-print 2610 one component of a set of parts such as the 3D-printable components of the set of parts 1000 described with particular reference to the examples of FIGS. 1 to 25. When the set of parts printed in 2610 by the manufacturing 3D printer is incomplete 2620, the method 2600 follows with procuring 2640 complementary parts to complete the 3D printed set of parts together with a set of non-3D-printable parts compatible with the 3D printed set of parts and an assembly guide from an external provider. When the 3D printed set of parts printed in 2610 by the manufacturing 3D printer is complete 2620, the method 2600 follows with procuring 2630 the set of non-3D-printable parts compatible with the 3D-printed set of parts and the assembly guide from the external provider. The method 2600 then continues with assembling 2650 a 3D printer from the set of parts and the set of non-3D printable parts.

Optionally, the method 2600 may further comprise downloading one or more electronic files, from a remote server, comprising a plurality of mesh representations (e.g., in CAD format, computer-aided manufacturing code format, etc.). The plurality of mesh representations represent at least the ones of the set of parts 3D printed by the manufacturing 3D printer. The method 2600 may then follow with compiling the electronic files into the instructions and storing the compiled instructions in one or more files, at the computer, compatible with the 3D manufacturing printer.

The method 2600 may also optionally further comprise downloading one or more Computer Assisted Drawing (CAD) files, from a remote server, comprising at least one CAD drawing at least partially presenting one or more components of the set of parts. In accordance with teachings from the procured assembly guide, the method 2600 may then follow with completing the CAD drawings for obtaining a plurality of mesh representations of at least the ones of the set of parts 3D printed by the manufacturing 3D printer (e.g., in the context of an academic learning experience at school or the like, at a summer and/or scientific camp or the like, etc.). Once the CAD files are correctly completed, the method 2600 follows with compiling the CAD files into the instructions and storing the compiled instructions in one or more files, at the computer, compatible with the 3D manufacturing printer.

The method 2600 may also optionally further comprise downloading one or more computer-aided manufacturing files, from a remote server, comprising the instructions at least partially presenting one or more components of the set of parts in computer-aided manufacturing code and storing the instructions in one or more files, at the computer, compatible with the 3D manufacturing printer.

Figure 27:
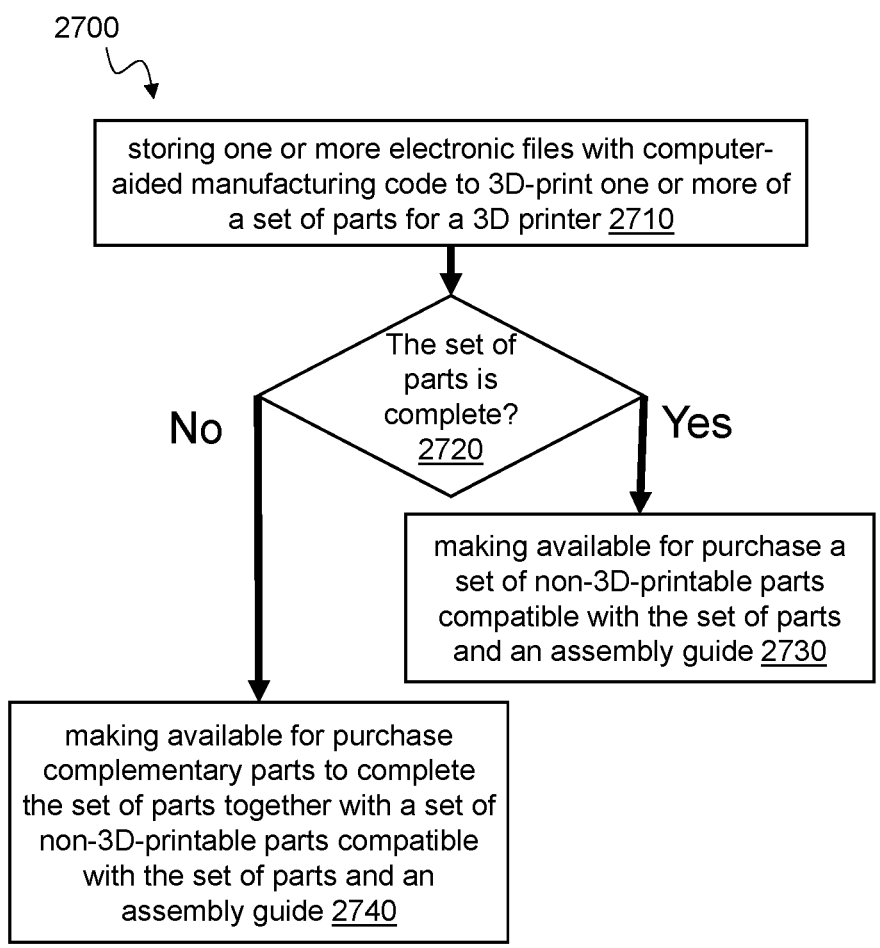
FIG. 27 is a flow chart of an exemplary method in accordance with the teachings of the present invention.

FIG. 27 shows a flow chart of an exemplary method for allowing a remote client to procure a 3D printer from a manufacturing 3D printer. The method 2700 comprises storing 2710 one or more electronic files, available for download from a server, comprising at least one of computer-aided manufacturing code and data for generating the computer-aided manufacturing code to 3D-print one or more components of a set of parts such as the 3D-printable components of the set of parts 1000 described with particular reference to the examples of FIGS. 1 to 25. When the computer-aided manufacturing code from 2710 allows to 3D-print only some of the set of parts printed by the manufacturing 3D printer 2720, the method 2700 comprises making 2740 available for purchase complementary parts to complete the 3D-printable set of parts with a set of non-3D-printable parts compatible with the set of parts and an assembly guide. When the computer-aided manufacturing code from 2710 allows to 3D-print the set of parts printed by the manufacturing 3D printer 2720, making 2730 available for purchase the set of non-3D-printable parts compatible with the set of parts and the assembly guide. The one or more electronic files may, for instance, comprise instructions to be executed as is by the manufacturing 3D printer. The one or more electronic files may also, in addition or alternatively, comprise at least one CAD drawing at least partially presenting at least the ones from set of parts to be 3D-printed at the manufacturing 3D printer. When complied, the CAD drawings provide instructions to be executed by the manufacturing 3D printer. The assembly guide may comprise teachings for completing the CAD drawings for obtaining a plurality of CAD drawings presenting at least the ones from the set of parts to be 3D printed by the manufacturing 3D printer. Completing the CAD drawings may be performed in the context of an academic learning experience (e.g., in the context of an academic learning experience at school or the like, at a summer and/or scientific camp or the like, etc.).

The description of the present invention has been presented for purposes of illustration but is not intended to be exhaustive or limited to the disclosed embodiments. The different views are not necessarily drawn to scale. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A set of parts for assembling a three-dimensional (3D) printer for 3D printing a specimen therewithin, the set of parts comprising:

an enclosure for receiving a controller of the 3D printer, the controller receiving instructions, when the 3D printer assembled from the set of parts is in use, for changing a definite 3D location of a hot end in relation to a specimen and for selectively extruding material from the hot end to print the specimen;

a hot end holder component for holding the hot end at the definite 3D location within the 3D printer when the set of parts is assembled into the 3D printer;

a specimen holder component for receiving the specimen within the 3D printer, the specimen holder component comprising a y-axis rack and pinion mechanism for moving a sliding plate component along a y-axis thereby determining a y-axis coordinate of the definite 3D location, at least a y-axis rack section of the y-axis rack and pinion mechanism being provided in a single material, the single material being used for the specimen holder component and the y-axis rack section;

an x-axis component comprising an x-axis rack and pinion mechanism for moving the hot end holder component along an x-axis along the enclosure over the specimen holder component thereby determining an x-axis coordinate of the definite 3D location, at least an x-axis rack section of the x-axis rack and pinion mechanism and structural elements of the x-axis component being provided in the single material; and a z-axis component for moving the specimen holder component along a z-axis along the enclosure thereby determining a z-axis coordinate of the definite 3D location when the set of parts is assembled into the 3D printer, wherein the single material is used for structural elements of the z-axis component.

2. The set of parts of claim 1, wherein an x-axis pinion section of the x-axis rack and pinion mechanism and a y-axis pinion section of the y-axis rack and pinion mechanism are provided in the single material, wherein the z-axis component is provided with the enclosure and comprises a z-axis rack and pinion mechanism for moving the specimen holder component along the z-axis, at least a z-axis rack section of the z-axis rack and pinion mechanism being provided in the single material as part of the structural elements of the z-axis component, wherein the single material is used for the structural elements of the z-axis component and the z-axis rack section and wherein a z-axis pinion section of the z-axis rack and pinion mechanism is provided in the single material thereby providing the rack and pinions mechanisms along the x-axis, the y-axis and the z-axis in the single material.

3. The set of parts of claim 2, wherein a single gear depth is determined for the x-axis rack and pinion mechanism and the y-axis rack and pinion mechanism considering a tolerancing of the single material during production of the 3D printer.

4. The set of parts of claim 1, wherein the single material is a 3D printable material and wherein the tolerancing for the 3D printable material is determined from a non-transitory electronic computer readable medium that contains instructions that, when executed by a manufacturing 3D printer, causes the manufacturing 3D printer to 3D-print:
the hot end holder component;
the specimen holder component comprising the y-axis rack and pinion mechanism;
the x-axis component comprising the x-axis rack and pinion mechanism;
the z-axis component; and
the enclosure.

5. The set of parts of claim 1, wherein the single material is a 3D printable material and wherein one or more tolerancing values for the tolerancing for the 3D printable material is set by the non-transitory electronic computer readable medium considering precision limits of the manufacturing 3D printer.

6. The set of parts of claim 4, wherein the specimen is a component of an additional 3D printer comprising an additional hot end holder component, an additional specimen holder component comprising an additional y-axis rack and pinion mechanism, an additional x-axis component comprising an additional x-axis rack and pinion mechanism, an additional z-axis component and an additional enclosure.

7. The set of parts of claim 1, wherein the specimen holder component further comprises a removable receiver tray positioned over the sliding plate, the specimen being printed thereon, when the 3D printer assembled from the set of parts is in use, by controllably varying the definite 3D location of the hot end holder component while extruding a compatible material though the hot end in accordance with the received instructions, wherein the removable receiver tray further comprises a specimen receiving plate, the specimen receiving plate being only partially supported in the removable receiver tray, thereby increasing the precision of the positioning of the receiving plate in the removable receiver tray position.

8. The set of parts of claim 1, further comprising:
an x-axis motor to be assembled in direct connection with the x-axis pinion section of the x-axis rack and pinion mechanism for moving the tool holder component along the x-axis within the 3D printer; and
a y-axis motor to be assembled in direct connection with the y-axis pinion section of the y-axis rack and pinion mechanism for moving the specimen holder component along the y-axis within the 3D printer.

9. The set of parts of claim 8, further comprising:
an x-axis limit-switch for the x-axis component;
a y-axis limit-switch for the specimen holder component; and
a z-axis limit-switch for the z-axis component, the x-axis limit-switch, the y-axis limit-switch and the z-axis limit-switch being for calibrating the definite 3D location within the 3D printer when the 3D printer assembled from the set of parts is in use.

10. The set of parts of claim 1, wherein the z-axis component is provided with the enclosure and comprises a first groove defining a first plane along the z-axis for slidably receiving lateral sides of the specimen holder component and wherein the set of parts further comprises a specimen holder adjustment tabs to be assembled on the specimen holder component in parallel to the first plane to impede non-z-axis-movements of the specimen holder component in the first groove.

11. The set of parts of claim 1, wherein the y-axis component provides a second groove defining a second plane along the y-axis for slidably receiving lateral sides of the sliding plate component and wherein the set of parts further comprises one or more sliding plate adjustment tabs to be assembled over the specimen holder component in parallel to the second plane to impede non-y-axis movements of the sliding plate component in the second groove.

12. A three-dimensional (3D) printer for 3D-printing a specimen therewithin comprising:
a hot end;
a controller that:
sets a definite 3D location of the hot end in relation to the specimen; and
controls the hot end for selectively extruding material to 3D-print the specimen;
an enclosure with a first groove defining a first plane along a z-axis within the 3D printer;
a hot end holder on the enclosure that moves the hot end along an x-axis within the 3D printer in accordance with instructions received from the controller, thereby determining an x-axis coordinate of the definite 3D location;
a specimen holder component, maintained in the first groove of the enclosure, comprising:
a sliding plate over which the specimen is 3D-printed by the hot end;
a second groove defining a second plane along a y-axis within the 3D printer, the first plane and the second plane being perpendicular; and
a y-axis motor assembly that causes the sliding plate to slide in the second groove in accordance with instructions received from the controller, thereby determining a y-axis coordinate of the definite 3D location; and
a z-axis motor assembly on the enclosure that causes the specimen holder component comprising the z-axis motor assembly to slide in the first groove along the first plane in accordance with instructions received from the controller, thereby determining a z-axis coordinate of the definite 3D location, wherein the single material is used for structural elements of the z-axis motor assembly.

13. The 3D printer of claim 12, wherein the first plane and second plane intersect along an edge of the specimen holder component in the x-axis.

14. The 3D printer of claim 12, further comprising a removable receiver tray positioned over the sliding plate and comprising a specimen receiving plate, the specimen being printed thereon, wherein the specimen receiving plate is only partially supported in the removable receiver tray, thereby increasing precision of positioning of the receiving plate in the removable receiver tray.

15. The 3D printer of claim 12, wherein the y-axis motor assembly comprises:
- a y-axis rack and pinion mechanism, the y-axis rack thereof being integrated in the sliding plate of the specimen holder component; and
- a y-axis motor, fixably maintained under the specimen holder component, for controllably rotating the y-axis pinion of the y-axis rack and pinion mechanism in accordance with instructions received from the controller.

16. The 3D printer of claim 12, wherein the z-axis-motor assembly comprises
- a z-axis rack and pinion mechanism, the z-axis rack thereof being integrated in the specimen holder component; and
- a z-axis motor, fixably maintained on the enclosure, for controllably rotating the z-axis pinion of the z-axis rack and pinion mechanism in accordance with instructions received from the controller.

17. The 3D printer of any one of claim 12, wherein the hot end holder comprises a x-axis-motor assembly comprising:
- an x-axis rack and pinion mechanism, the x-axis rack thereof being slidably engaged in a third groove of the enclosure along the x-axis and being solidarized with the hot end; and
- an x-axis motor, fixably maintained on the enclosure, for controllably rotating the x-axis pinion of the x-axis rack and pinion mechanism in accordance with instructions received from the controller.

18. The 3D printer of claim 12, further comprising:
- an x-axis limit-switch for the hot end holder;
- a y-axis limit-switch for the specimen holder component; and
- a z-axis limit-switch for the z-axis component, the x-axis limit-switch, the y-axis limit-switch and the z-axis limit-switch being for calibrating the definite 3D location within the 3D printer.

19. The 3D printer of any one of claim 12, further comprising specimen holder adjustment tabs on the specimen holder component in parallel to the first plane to impede non-z-axis-movements of the specimen holder component in the first groove.

20. The 3D printer of claim 12, further comprising one or more sliding plate adjustment tabs over the specimen holder component in parallel to the second plane to impede non-y-axis movements of the sliding plate component in the second groove.

* * * * *